(12) United States Patent
Zhang et al.

(10) Patent No.: US 10,484,130 B2
(45) Date of Patent: Nov. 19, 2019

(54) METHOD AND DEVICE FOR PARALLEL POLAR CODE ENCODING/DECODING

(71) Applicant: Huawei Technologies Co., Ltd., Shenzhen (CN)

(72) Inventors: Huazi Zhang, Hangzhou (CN); Gongzheng Zhang, Hangzhou (CN); Rong Li, Hangzhou (CN); Jun Wang, Hangzhou (CN); Wen Tong, Ottawa (CA); Yiqun Ge, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/717,745

(22) Filed: Sep. 27, 2017

(65) Prior Publication Data

US 2018/0097580 A1 Apr. 5, 2018

Related U.S. Application Data

(60) Provisional application No. 62/402,862, filed on Sep. 30, 2016.

(51) Int. Cl.
*H04L 1/00* (2006.01)
*H03M 13/13* (2006.01)
*H03M 13/09* (2006.01)

(52) U.S. Cl.
CPC .......... *H04L 1/0041* (2013.01); *H03M 13/13* (2013.01); *H04L 1/0057* (2013.01);
(Continued)

(58) Field of Classification Search
CPC .. H03M 13/09; H03M 13/13; H03M 13/2906; H03M 5/02; H04L 1/0057; H04L 1/0058; H04L 1/0063; H04L 1/0041
See application file for complete search history.

(56) References Cited

U.S. PATENT DOCUMENTS 9,628,113 B2 * 4/2017 Jeong ................. H03M 13/2906
2002/0194571 A1 * 12/2002 Parr ....................... H03M 13/09
714/800
(Continued)

FOREIGN PATENT DOCUMENTS

CN 103825669 A 5/2014
CN 105811998 A 7/2016
(Continued)

OTHER PUBLICATIONS

Huawei, HiSilicon, "Polar Code Construction for NR," 3GPP TSG RAN WG1 Meeting #86bis, Lisbon, Portugal, Oct. 10-14, 2016, R1-1608862, 8 pages.
(Continued)

*Primary Examiner* — Shelly A Chase
(74) *Attorney, Agent, or Firm* — Slater Matsil, LLP

(57) ABSTRACT

Embodiments of this disclosure enhance the error detection performance of parallel polar encoding by cross-concatenating parity bits between segments of information bits transmitted over different sets of sub-channels. In one embodiment, a first segment of information bits is transmitted over a first set of sub-channels, and at least a second segment of information bits, and a masked parity bit, are transmitted over a second set of sub-channels. A value of the masked parity bit is equal to a bitwise combination of a first parity bit computed from the first segment of information bits and a second parity bit computed from the second segment of information bits. The bitwise combination may be a bitwise AND, a bitwise OR, or a bitwise XOR of the respective parity bits.

24 Claims, 25 Drawing Sheets

(52) U.S. Cl.
CPC .......... *H04L 1/0058* (2013.01); *H04L 1/0063* (2013.01); *H03M 13/09* (2013.01)

(56) References Cited

U.S. PATENT DOCUMENTS

| | | |
|---|---|---|
| 2009/0307562 A1 | 12/2009 | Lee et al. |
| 2012/0207224 A1 | 8/2012 | Chow et al. |
| 2014/0169388 A1 | 6/2014 | Jeong et al. |
| 2014/0173376 A1 | 6/2014 | Jeong et al. |
| 2014/0208183 A1 | 7/2014 | Mandavifar et al. |
| 2014/0281823 A1 | 9/2014 | Micheloni et al. |
| 2015/0039966 A1 | 2/2015 | Fonseka et al. |
| 2015/0249473 A1 | 9/2015 | Li et al. |
| 2016/0204811 A1 | 7/2016 | Goela et al. |
| 2018/0034587 A1* | 2/2018 | Kim .................. H03M 5/12 |
| 2018/0076929 A1 | 3/2018 | Zhang et al. |

FOREIGN PATENT DOCUMENTS

| | | |
|---|---|---|
| EP | 2849377 A1 | 3/2015 |
| WO | 2014092502 A1 | 6/2014 |
| WO | 2014102565 A1 | 7/2014 |
| WO | 2018201409 A1 | 11/2018 |

OTHER PUBLICATIONS

Niu, Kai et al.,"Polar Codes: Primary Concepts and Practical Decoding Algorithms," IEEE Communications Magazine, Jul. 2014, No. 7, vol. 52, ISSN:0163-6804, pp. 192-203.

3GPP TSG RAN WG1 Meeting #87, "Details of the Polar code design," R1-1611254, Huawei, HiSilicon, Reno, USA, Nov. 10-14, 2016, 15 pages.

Arikan, Erdal, "Channel polarization: A Method for Constructing Capacity-Achieving Codes for Symmetric Binary-Input Memoryless Channels," IEEE, Jul. 20, 2009, 23 pages.

Mori, Ryuhei, "Performance and Construction of Polar Codes on Symmetric Binary-Input Memoryless Channels," Department of Systems Science, Kyoto University, May 23, 2009, 5 pages.

Tal, Ido, et al., "List Decoding of Polar Codes," University of California, San Diego, May 31, 2012, 11 pages.

Trifonov, Peter, "Efficient Design and Decoding of Polar Codes," IEEE Transactions on Communications, vol. 60, No. 11, Nov. 2012, 7 pages.

Huawei et al., "Channel coding for control channels," 3GPP TSG RAN WG1, Meeting #86, R1-167216, Aug. 22-26, 2016, 8 pages.

Huawei et al., "Channel coding schemes for mMTC scenario," 3GPP TSG RAN WG1, Meeting #86, R1-167215, Aug. 22-26, 2016, 9 pages.

Huawei et al., "Polar code design and rate matching," 3GPP TSG RAN WGI, Meeting #86, R1-167209, Aug. 22-26, 2016, 5 pages.

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

Trifonov, P. et al., "Polar Subcodes", IEEE Journal on Selected Areas in Communications, Feb. 2016, 14 Pages, vol. 34, No. 2, XP11593857A.

Wang, T. et al., "Parity-Check-Concatenated Polar Codes", IEEE Communications Letters, Dec. 2016, 4 Pages, vol. 20, No. 12, XP55607890A.

* cited by examiner

METHOD AND DEVICE FOR PARALLEL POLAR CODE ENCODING/DECODING

This application claims priority to U.S. Provisional Application No. 62/402,862 filed on Sep. 30, 2016 and entitled "Method and Device for Parallel Polar Code Encoding/Decoding," which is incorporated by reference herein as if reproduced in its entireties.

TECHNICAL FIELD

The present invention relates generally to a communications, and, in particular embodiments, to a method and device for parallel polar code encoding/decoding.

BACKGROUND

Polar codes are proposed as channel codes for use in future wireless communications, and have been selected for uplink and downlink enhanced Mobile Broadband (eMBB) control channel coding for the new 5th Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect sub-channels is equal to the capacity of a channel.

SUMMARY

Technical advantages are generally achieved, by embodiments of this disclosure which describe a method and apparatus for polarization encoding.

In accordance with an embodiment, a method for polar code encoding is provided. In this example, the method includes transmitting at least a first segment of information bits over a first set of sub-channels, and transmitting at least a second segment of information bits, and a masked parity bit, over a second set of sub-channels. a value of the masked parity bit is equal to a bitwise combination of a first parity bit computed from the first segment of information bits and a second parity bit computed from the second segment of information bits. In one example, the method further includes mapping the first segment of information bits to sub-channels in the first set of sub-channels, mapping the second segment of information bits to sub-channels in the second set of sub-channels, and computing at least the first parity bit based on the first segment of information bits in the first set of sub-channels and at least the second parity bit based on the second segment of information bits in the second set of sub-channels. In that example, or in another example, the masked parity bit is transmitted over a single sub-channel in the second set of sub-channels. In such an example, none of the first parity bit, the second parity bit, and the masked parity bit may be transmitted over the first set of sub-channels. Additionally or alternatively, the masked parity bit may be transmitted over both a single sub-channel in the second set of sub-channels and a single sub-channel in the first set of sub-channels. Additionally or alternatively, the first parity bit may be transmitted over a single sub-channel in the first set of sub-channels. Additionally or alternatively, the first parity bit and the second parity bit may be transmitted over different sub-channels in the second set of sub-channels. Additionally or alternatively, neither the first parity bit nor the second parity bit may be transmitted over the first set of sub-channels. Additionally or alternatively, the first parity bit and the second parity bit may be transmitted over the first set of sub-channels. In any one of the above mentioned examples, or in another example, the first parity bit may be transmitted over a single sub-channel in the second set of sub-channels without being transmitted over any sub-channel in the first set of sub-channels, and the second parity bit may be transmitted over a single sub-channel in the first set of sub-channels without being transmitted over any sub-channel in the second set of sub-channels. In any one of the above mentioned examples, or in another example, the method may further include computing the masked parity bit according to a bitwise AND of the first parity bit and at least the second parity bit, computing the masked parity bit according to a bitwise OR of the first parity bit and at least the second parity bit, or computing the masked parity bit according to a bitwise XOR of the first parity bit and at least the second parity bit. In any one of the above mentioned examples, or in another example, the method may further include before transmitting, polar encoding at least the first segment of information bits, and separately polar encoding at least the second segment of information bits and the masked parity bit. In any one of the above mentioned examples, or in another example, the masked parity bit may be a cyclic redundancy check (CRC) bit, a parity check bit, or an error correcting code (ECC) bit. In any one of the above mentioned examples, or in another example, the first parity bit may be computed directly from the first segment of information bits, and the second parity bit may be computed directly from the second segment of information bits. An apparatus for performing this method is also provided.

In accordance with another embodiment, a method for polar code decoding is provided. In this example, the method includes receiving a first polar-encoded bit-stream carrying at least first segment of information bits over a first set of sub-channels, and a second polar-encoded bit-stream carrying at least a second segment of information bits and a masked parity bit over a second set of sub-channels. A value of the masked parity bit is equal to a bitwise combination of a first parity bit computed from the first segment of information bits and a second parity bit computed from the second segment of information bits. In one example, the method further includes performing error detection on the first segment of information bits received over the first set of sub-channels in accordance with at least the masked parity bit received over the first set of sub-channels. In any one of the above mentioned examples, or in another example, the first parity bit may be computed directly from the first segment of information bits, and the second parity bit may be computed directly from the second segment of information bits. An apparatus for performing this method is also provided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figures 1, 2:
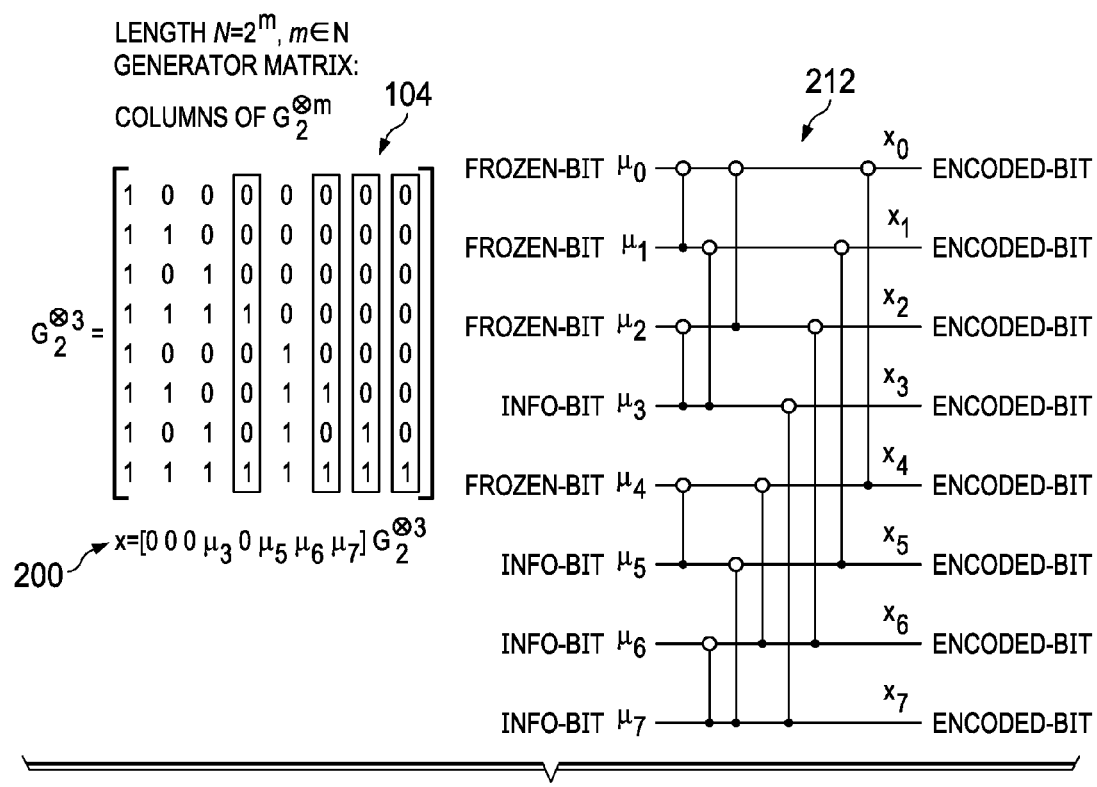
FIG. 1 is a diagram showing one example of how a polar coding generator matrix can be produced from a kernel.
FIG. 2 is a diagram showing an example use of a polar coding generator matrix for producing codewords and a schematic illustration of an example polar encoder.

The making and using of the embodiments are discussed in detail below. It should be appreciated, however, that the present disclosure provides many applicable inventive concepts that can be embodied in a wide variety of specific contexts. The specific examples being described are merely illustrative of specific ways to make and use the embodiments of this disclosure, and do not limit the scope of the claims. The term "parity bit" is used loosely to refer to any assistant bit that is used for error detection when decoding information bits, including (but not limited to) Cyclic Redundancy Check (CRC) bits, checksums bits, hash function bits, cryptographic codes, repetition codes, or error detection bits or codes. The terms "parity bits", "parity check (PC) bits", "dynamic frozen bits", and "parity check (PC) frozen bits" (or "PF bits" for short) are used interchangeably throughout this disclosure.

Because code length directly correlates to sub-channel reliability, longer polar codes generally provide better block error rate (BLER) performance than shorter polar codes. Despite providing better BLER performance, longer polar codes do have some practical disadvantages such as increased decoding latency, and as a result, the maximum code length for a given implementation may be constrained by performance requirements of the system.

One strategy for mitigating latency, while also achieving BLER performance that is similar to longer polar codes, is to divide a sequence of information bits into multiple segments, and then encode the respective segments of information bits in parallel using shorter chained polar codes. The resulting polar encoded bit streams are then transmitted over different sets of sub-channels.

Parity bits may be added to a string of information bits during polar encoding to assist in decoding and to facilitate error detection or correction at the receiver, and in conventional parallel polar encoding schemes, parity bits are transmitted over the same set of sub-channels as the information bits from which the parity bits are computed. That is to say, conventional parallel polar encoding schemes map each segment of information bits to a different set of sub-channels, compute parity bits based on each respect segment of information, and then map the resulting parity bits to the same set of sub-channels as the segment of information bits from which the parity bits were computed.

Embodiments of this disclosure enhance the error detection performance of parallel polar encoding by cross-concatenating parity bits between segments of information bits transmitted over different sets of sub-channels. Parity bit cross-concatenation may reduce the overhead on one segment and/or enhance error detection performance by allowing parity bits communicated over multiple set of sub-channels to be compared during polar decoding to determine whether the received/decoded parity bit values are correct. In a straightforward example, a parity bit is computed from one segment of information bits, and then transmitted over two sets of sub-channels. Upon reception, the decoder can compare the parity check bit values to see if they are the same. If not, the decoder may request that the parity check value be retransmitted, without re-transmitting the entire segment of information bits. Other examples are also possible.

Parity bit cross-concatenation occurs when a parity bit is computed from one segment of information bits, and then transmitted over at least one set of sub-channels that carries a different segment of information bits. As referred to herein, a given parity bit is deemed to be "computed from" a segment of information bits when the given parity bit is computed directly from the segment of information bits or is a masked parity bit corresponding to a bitwise combination of a parity bit computed directly from the segment of information bits and at least one additional parity bit computed from a different segment of information bits. As referred to herein, a parity bit is computed "directly from" a segment of information bits when a value of the parity bit is a function of the information bit values in the segment of information bits, and is not dependent on, or otherwise affected by, information bit values in any other segment of information bits. Additionally, as used herein, the term "bitwise combination" refers to the output of a bitwise function/operation of two or more bits. For example, a bitwise combination of a first parity bit computed directly from the first segment of information bits and at least a second parity bit computed directly from the second segment of information bits may comprise a bitwise NOT of the respective parity bits, a bitwise AND of the respective parity bits, a bitwise OR of the respective parity bits, or a bitwise XOR of the respective parity bits.

In another embodiment, the parity bit transmitted over the second set of sub-channels is a masked parity bit whose value is a bitwise combination of a first parity bit computed directly from the first segment of information bits and at least a second parity bit computed directly from the second segment of information bits. As used herein, the term "bitwise combination" refers to the output of a bitwise function/operation of two or more bits. For example, a bitwise combination of a first parity bit computed directly from the first segment of information bits and at least a second parity bit computed directly from the second segment of information bits may comprise a bitwise NOT of the respective parity bits, a bitwise AND of the respective parity bits, a bitwise OR of the respective parity bits, or a bitwise XOR of the respective parity bits. These and other examples and described in greater detail below.

As mentioned above, there are a variety of different embodiment cross-concatenation schemes provided by this disclosure. The following embodiments will be described with the understanding that a first segment of information bits are transmitted over a first set of sub-channels and a second segment of information bits, as well as at least one parity bit computed from at least the first segment of information bits, are transmitted over a second set of sub-channels. Unless stated otherwise, it should be appreciated that the first segment of information bits is not transmitted over the second set of sub-channels. Likewise, it should be appreciated that descriptions referring to parity bit cross-concatenation between the first segment of information bits and the second segment of information bits are not limited to cross-concatenation between two segments of information bits, and may be applied to parity-bit cross-concatenation between three or more segments of information bits as well.

In one embodiment, a parity bit computed directly from the first segment of information bits is transmitted over the second set of sub-channels is. In such an embodiment, the parity bit may or may not be transmitted over the first set of sub-channels as well. In another embodiment, a masked parity bit is transmitted over the second sub-set of sub-channels. In such an embodiment, the masked parity bit is a bitwise combination parity bits computed directly from the first segment of information bits and at least the second segment of information bits. The masked parity bit may or may not be transmitted over the first set of sub-channels as well. These and other features are described in greater detail below.

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$ (e.g. for n=1, $G_2=F$ (indicated as 100 in FIG. 1)). For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) based decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance, or to detect whether one codeword is decoded correctly during or after the decoding. During encoding, an N-bit input vector could be formed from K information bits including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation: SC decoding and List decoding. SC decoding is a special case of SCL decoding, with list size L=1. An SC decoder tracks only one decoding path. After the value of a decoded bit is estimated, the other possible value is ignored. Decoding continues with the next bit, assuming that each previous bit has been correctly estimated when updating partial sum results.

Figure 3:
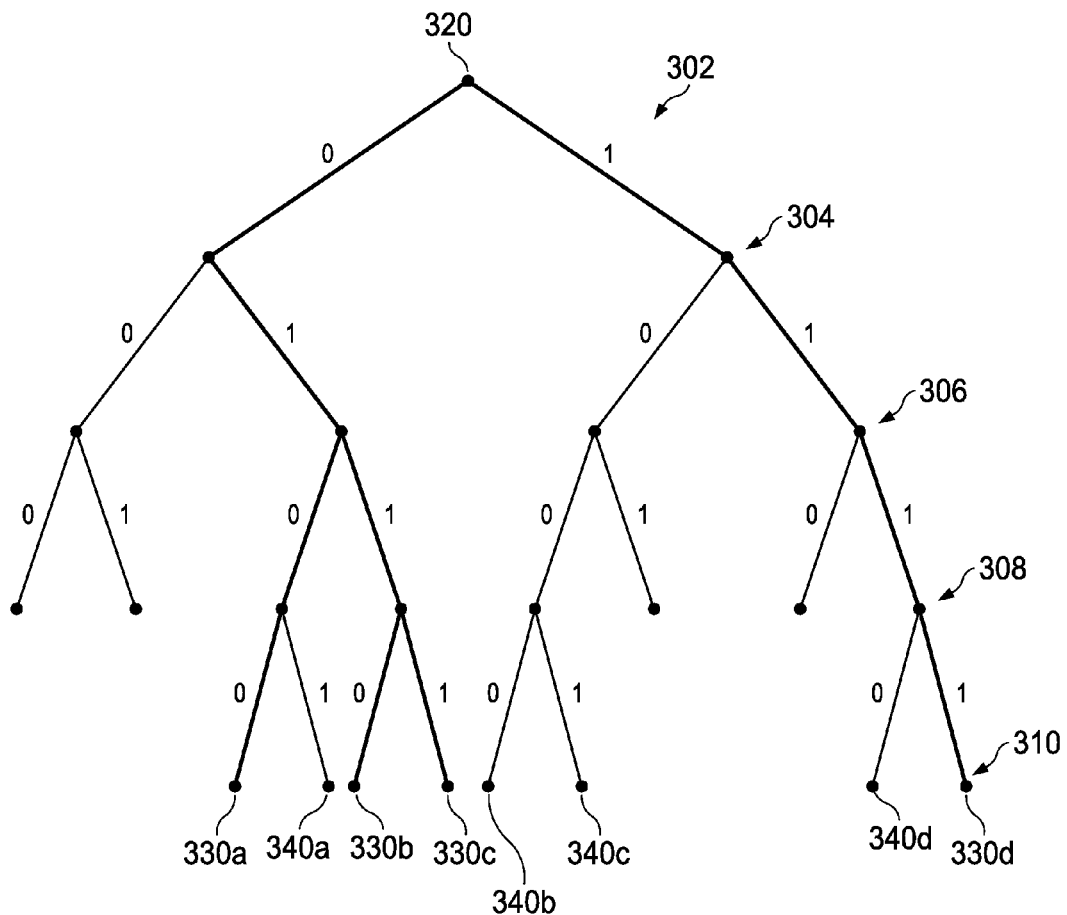
FIG. 3 is a diagram showing a portion of an example decision list tree whose width is limited by a maximum given list size and used in a Successive Cancellation List (SCL) polar decoder.

FIG. 3 is a diagram showing a portion of an example decision list tree 300 used in an SCL polar decoder, whose width is limited by a maximum given list size L. In FIG. 3 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330*a*, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 3. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides the channel into N sub-channels. N is referred to as the mother code length and is always a power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
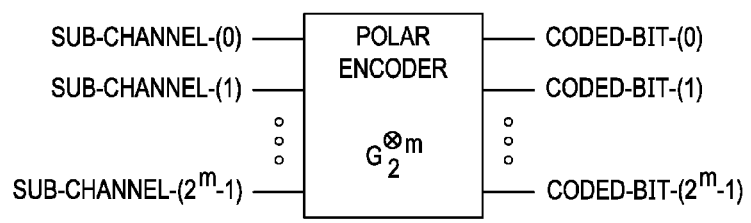
FIG. 4 is a block diagram illustrating an example of a polar encoder based on a 2-by-2 kernel.

Polar encoders based on Kronecker products of a 2-by-2 Arikan kernel $G_2$ are described above. FIG. 4 is a block diagram illustrating an example of a polar encoder 400 based on a 2-by-2 kernel. Sub-channels and coded bits are labeled in FIG. 4. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=L^n$, where L is the dimension (i.e., size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the synthesized sub-channels. Some synthesized sub-channels have high capacity, and some sub-channels have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

A Gaussian-approximation (GA) method proposed in P. Trifonov, "Efficient design and decoding of polar codes." IEEE Trans. on Communications 60.11 (2012): 3221-3227, assumes that every coded bit is subjected to an equal error probability. From the error probability, the reliabilities over the sub-channels are obtained with a density evolution (DE)

algorithm. Because this error probability on the coded bits is related to the receiving SNR, this method is SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed offline (i.e. in advance) to produce pre-computed (and static) ordered sequences that can be stored and retrieved during subsequent coding operations. In yet another alternative, the computations may be performed partially online and partially offline.

In mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

Figure 5:
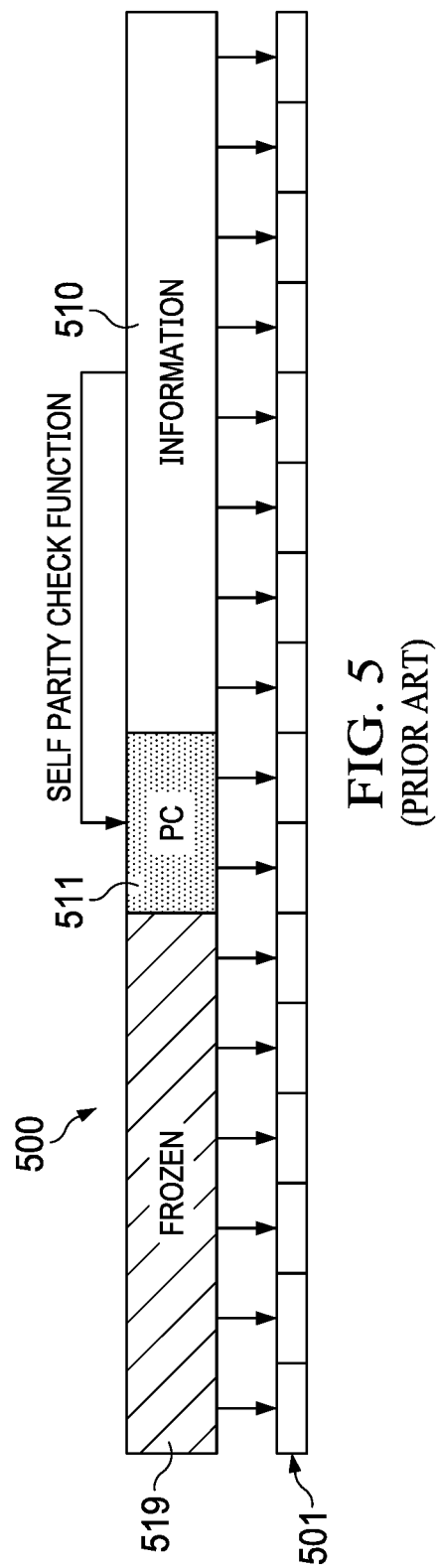
FIG. 5 is a diagram of a conventional polar encoding scheme.

Conventional polar encoding schemes map parity bits to the same set of sub-channels as the information bits from which the parity bits are computed. FIG. 5 is a diagram of a conventional polar encoding scheme 500 where a sequence of information bits 510, parity bits 511, and frozen bits 519 are mapped to sub-channels in a set of sub-channels 501. As shown, the parity bits 511 are computed directly from the sequence of information bits 510 using a self parity-check function, and then the transmitted over the same set of sub-channels 501 as the sequence of information bits 510.

Figure 6:
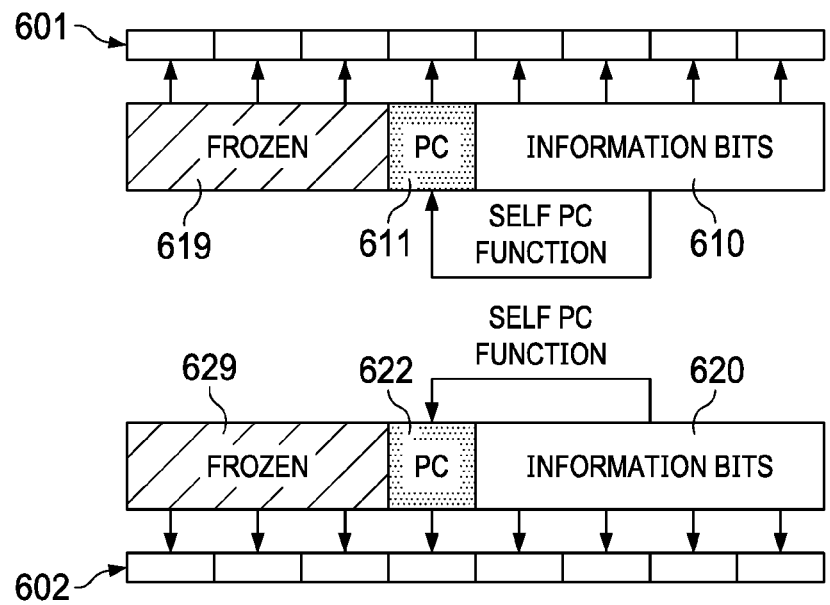
FIG. 6 is a diagram of a conventional parallel polar encoding technique.

As mentioned above, longer polar codes generally provide improved BLER performance when compared to shorter polar codes at the expense of increased decoding latency. One strategy for mitigating latency, while also achieving similar BLER performance levels as longer polar codes, is to divide a sequence of information bits into multiple segments, and then encode the respective segment in parallel using shorter chained polar codes. FIG. 6 is a diagram of a conventional parallel polar encoding technique 600 where segments of information bits 610, 620 are transmitted over different sets of sub-channels 601, 602. As shown, parity bits 611 are computed directly from the sequence of information bits 610 using a self parity-check function, and parity bits 622 are computed directly from the sequence of information bits 620 using a self parity-check function. Thereafter, the parity bits 611 are transmitted over the same set of sub-channels 601 as the segment of information bits 610 from which the parity bits 611 were computed, and the parity bits 622 are transmitted over the same set of sub-channels 602 as the segment of information bits 620 from which the parity bits 622 were computed. Frozen bits 619, 629 are also transmitted over the respective sets of sub-channels 601, 602.

Embodiments of this disclosure provide parity bit cross-concatenation techniques that transmit parity bits over a different set of sub-channels than a segment of information bits from which the parity bits were computed. FIGS. 7A-7I are diagrams of embodiment parallel polar encoding schemes 781-789 for cross-concatenating parity bits between segments of information bits 710, 720 that are transmitted over different sets of sub-channels 701, 702. As shown, in each of the embodiment parallel polar encoding schemes 781-789, the segment of information bits 710 and the frozen bits 719 are transmitted over the set of sub-channels 701, while the segment of information bits 720 and the frozen bits 729 are transmitted over the set of sub-channels 702. One or more of the parity bits 711-723 are also transmitted over one or both of the sub-channels 701, 702 in each of embodiment parallel polar encoding schemes 781-789, although the number e of parity bits that are transmitted over a given set of sub-channels varies depending on the cross-concatenation technique/scheme that is being implemented by the embodiment parallel polar encoding schemes 781-789. While each of the parity bits 711-723 are depicted as a single parity bit mapped to a single sub-channel, it should be appreciated that multiple parity bits may be generated by applying a self or cross PC function check on a given segment of information bits.

Figure 7A:
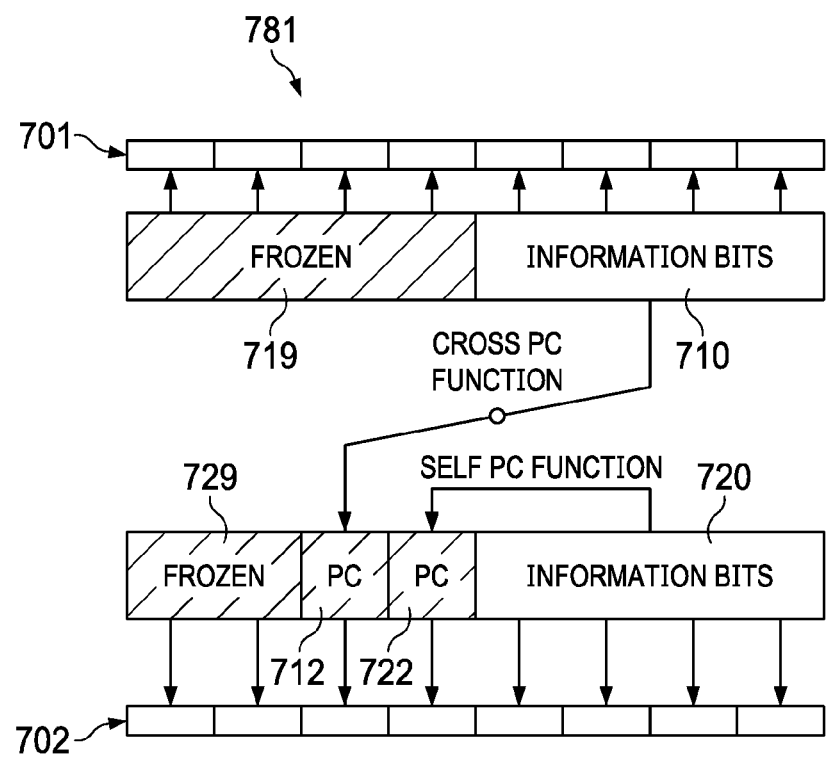
FIGS. 7A-7I are diagrams of embodiment parallel polar encoding schemes for implementing polarity bit cross-concatenation.

In FIG. 7A, the embodiment parallel polar encoding scheme 781 generates the parity bit 712 directly from the segment of information bits 710 according to a cross parity check function, and the parity bit 722 directly from the segment of information bits 720 according to a self parity check function. The parity bits 712, 722 are then transmitted over the set of sub-channels 702.

Figure 7B:
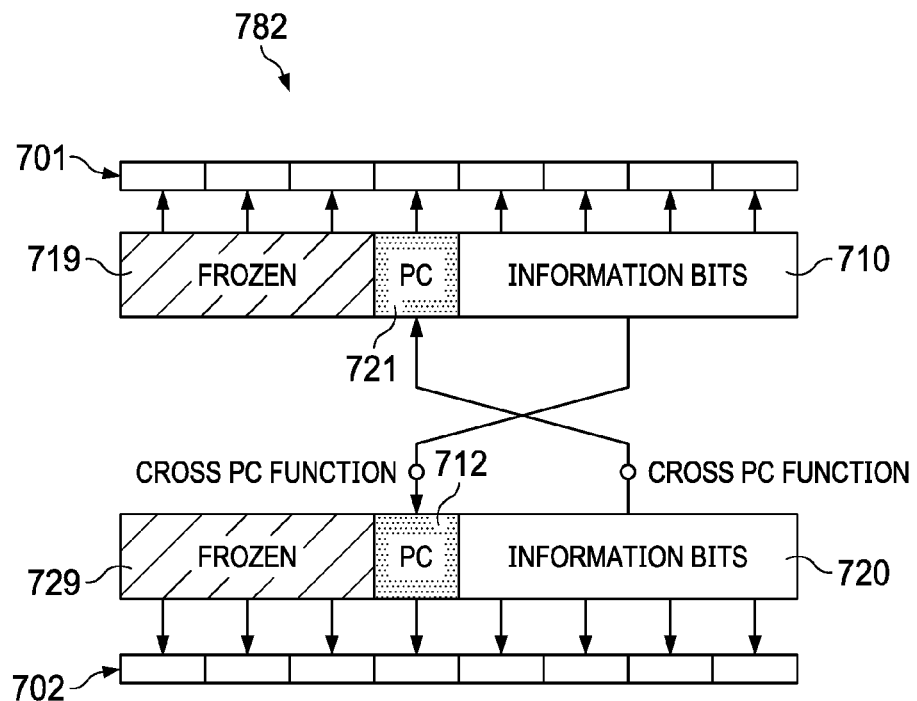

In FIG. 7B, the embodiment parallel polar encoding scheme 782 generates the parity bit 712 directly from the segment of information bits 710 according to a cross parity check function, and the parity bit 721 directly from the segment of information bits 720 according to a cross parity check function. Thereafter, the parity bit 721 is transmitted over the set of sub-channels 701, and the parity bits 712 is transmitted over the set of sub-channels 702.

Figure 7C:
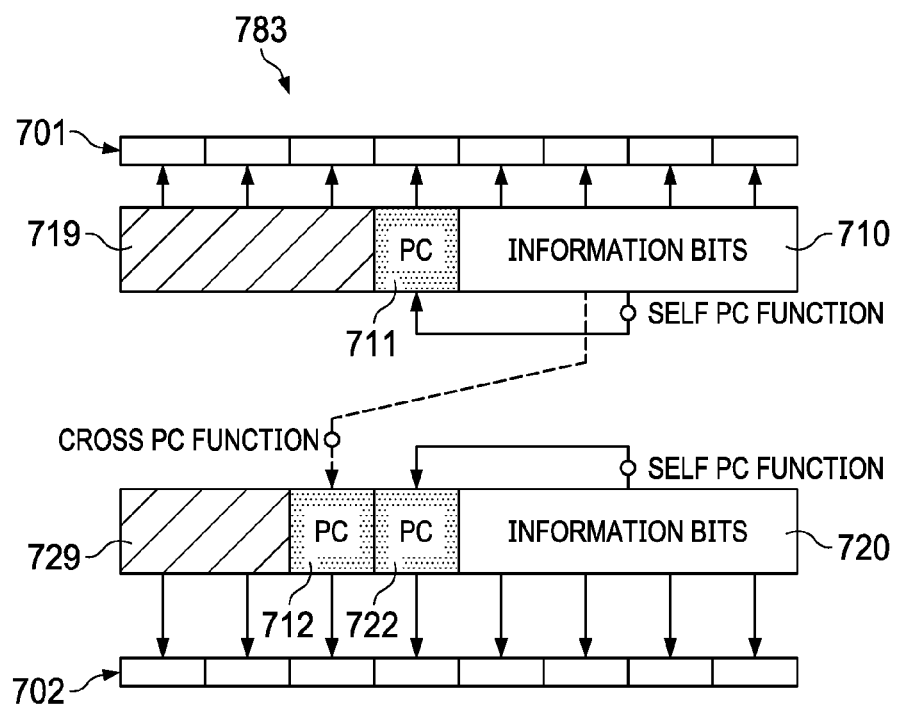

In FIG. 7C, the embodiment parallel polar encoding scheme 783 generates the parity bit 711 directly from the segment of information bits 710 according to a self parity check function, the parity bit 712 directly from the segment of information bits 710 according to a cross parity check function, and the parity bit 722 directly from the segment of information bits 720 according to a self parity check function. Thereafter, the parity bit 711 is transmitted over the set of sub-channels 701, and the parity bits 712, 722 are transmitted over the set of sub-channels 702. Because the parity bits 711 and 712 are computed from the same information bit values, their values may be correlated depending on the self and cross parity check functions used to generate the parity bits 711, 712. By way of example, if the self and cross parity check functions rely on the same underlying parity check algorithm, then the parity bits 711, 712 should have the same value. In this way, the decoder can compare the received values of the parity bits 711, 712, and if they differ, the determine that the error detection step for the segment of information bits 710 is unreliable. Alternatively, if the parity bits 711, 712 have different received/decoded values, then the decoder may rely on the parity bit that is mapped to the mapped to the more reliable sub-channel. Notably, the self and cross parity check functions could only generate opposite values (e.g., parity bit 711=NOT(parity bit 712), in which case the decoder would determine that the error detection step is not reliable when the received values of the parity bits 711, 712 match. Other examples are also possible.

Figure 7D:
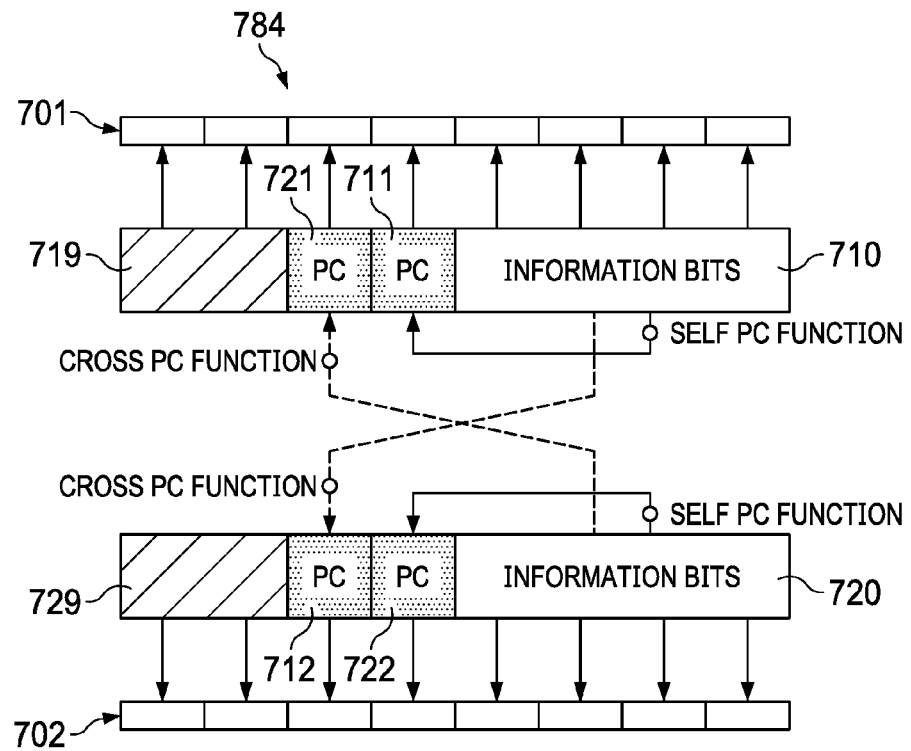

In FIG. 7D, the embodiment parallel polar encoding scheme 784 generates the parity bit 711 directly from the segment of information bits 710 according to a self parity check function, the parity bit 712 directly from the segment of information bits 710 according to a cross parity check function, the parity bit 722 directly from the segment of information bits 720 according to a self parity check function, and the parity bit 721 directly from the segment of information bits 720 according to a cross parity check function. Thereafter, the parity bits 711, 721 are transmitted over the set of sub-channels 701, and the parity bits 712, 722 are transmitted over the set of sub-channels 702. Similar to FIG. 7C, the received values of the parity bits 711, 712 may be compared by the decoder to determine whether error detection for the segment of information bits 710 is reliable. Likewise, the received values of the parity bits 712, 721 may be compared by the decoder to determine whether error detection for the segment of information bits 720 is reliable.

In some embodiments, masking bits may be transmitted over one or more sets of sub-channels. A masking bit may be generated by computing two or more parity bits from two or more different segments of information bits, and then computing a bitwise combination of the two or more parity bits to obtain the masking bit. The "bitwise combination" may be the output of a bitwise NOT of the respective parity bits, a bitwise AND of the respective parity bits, a bitwise OR of the respective parity bits, a bitwise XOR of the respective parity bits, or a combination thereof. The output of a bitwise AND of two parity bits is one when both parity bits are set to one, and zero when either of the parity bits is zero. The output of a bitwise OR of two parity bits is one when either of the parity bits are set to one and zero when both of the parity bits are set to zero. The output of a bitwise OR of two parity bits is one when either of the parity bits are set to one and zero when both of the parity bits are set to zero. The output of a bitwise XOR of two parity bits is zero when the parity bits are set to the same value and one when the parity bits are set to different values. In some examples, the bitwise combination is the output of a combination of multiple bitwise operations. For example, a bitwise combination may be equal to NOT(XOR(PC1, PC2), where PC1 and PC2 are parity bit values. Other examples are also possible.

Figure 7E:
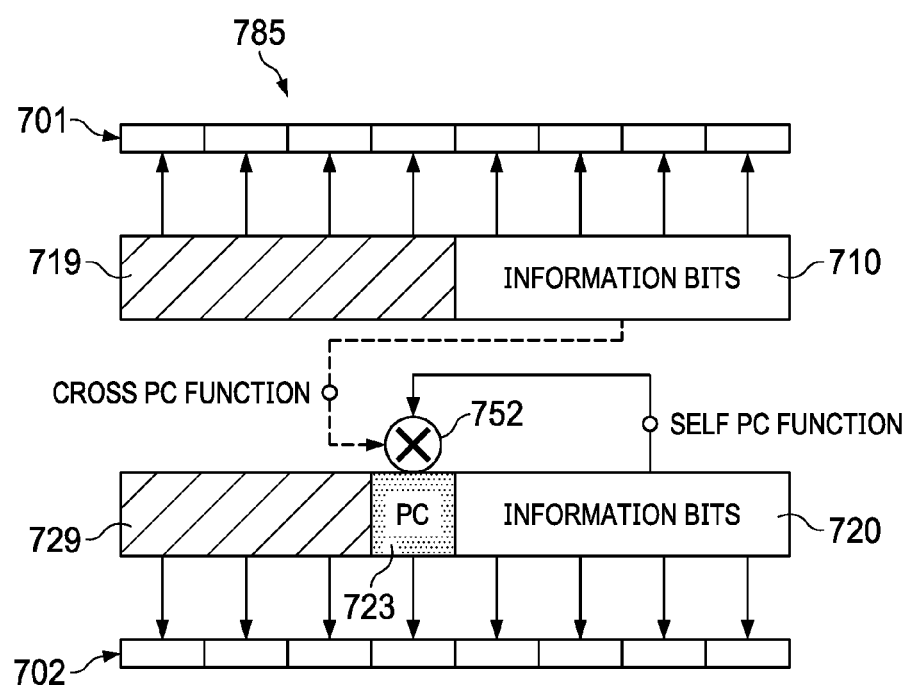

In FIG. 7E, the embodiment parallel polar encoding scheme 785 generates the masked parity bit 723 based on a bitwise combination 752 of a first parity bit computed directly from the segment of information bits 710 according to a cross parity check function and a second parity bit 722 computed directly from the segment of information bits 720 according to a self parity check function. The masked parity bit 723 is then transmitted over the set of sub-channels 702.

Figure 7F:
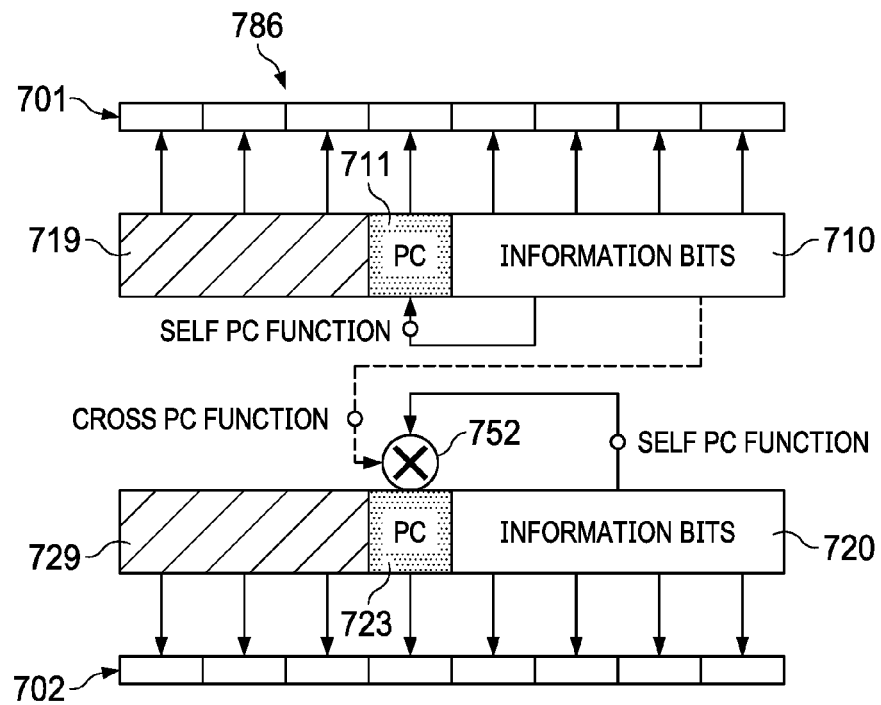

In FIG. 7F, the embodiment parallel polar encoding scheme 786 generates the masked parity bit 723 in the same manner as the embodiment parallel polar encoding scheme 785, and the parity bit 711 directly from the segment of information bits 710 according to a self parity check function. Thereafter, the parity bit 711 is transmitted over the set of sub-channels 701, and the parity bit 723 is transmitted over the set of sub-channels 702. Because an input parameter of the masked parity bit 723 is computed from the same segment of information bits as the parity bit 711, it should be appreciated that the decoder may compare, or otherwise process, the received values of the masked parity bit 723 and the parity bit 711 to determine whether the error detection step for the segment of information bits 710 is reliable. Likewise, because the other input parameter of the masked parity bit 723 is computed from the segment of information bits 720, comparing/processing the values of masked parity bit 723 and the parity bit 711 may also provide an indication as to the reliability of the error detection step for the segment of information bits 720.

Figure 7G:
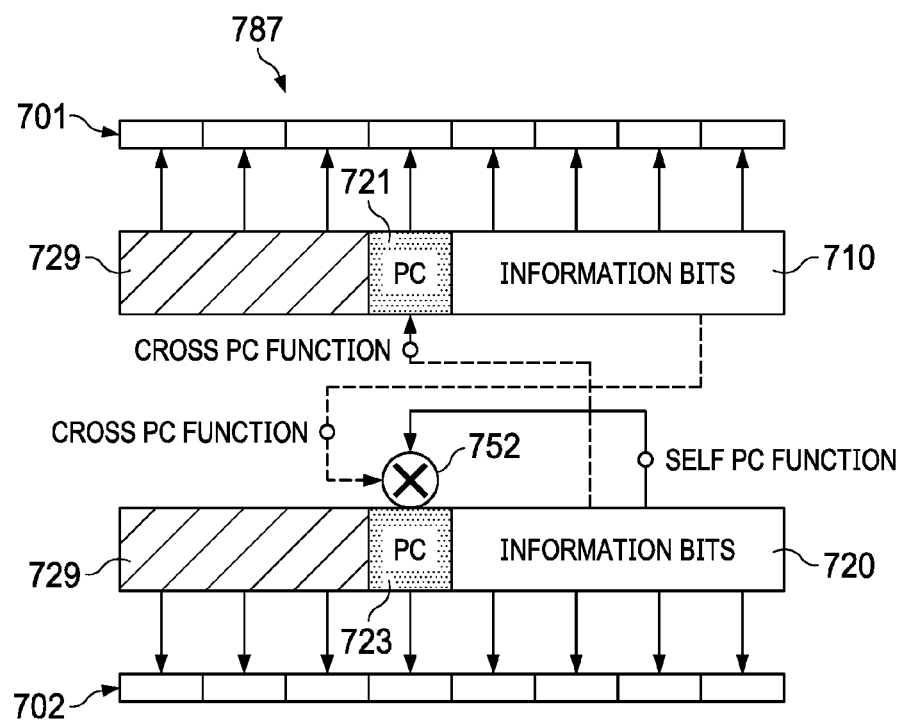

In FIG. 7G, the embodiment parallel polar encoding scheme 787 generates the masked parity bit 723 in the same manner as the embodiment parallel polar encoding scheme 785, and also generates the parity bit 721 directly from the segment of information bits 720 according to a cross parity check function. Thereafter, the parity bit 721 is transmitted over the set of sub-channels 701, and the parity bit 723 is transmitted over the set of sub-channels 702. For reasons similar to those discussed above with respect to FIG. 7F, the received values of the parity bits 721 and the masked parity bit 723 may be compared/processed by the decoder to determine whether error detection for the segment of information bits 710 and/or the segment of information bits 720 is reliable.

Figure 7H:
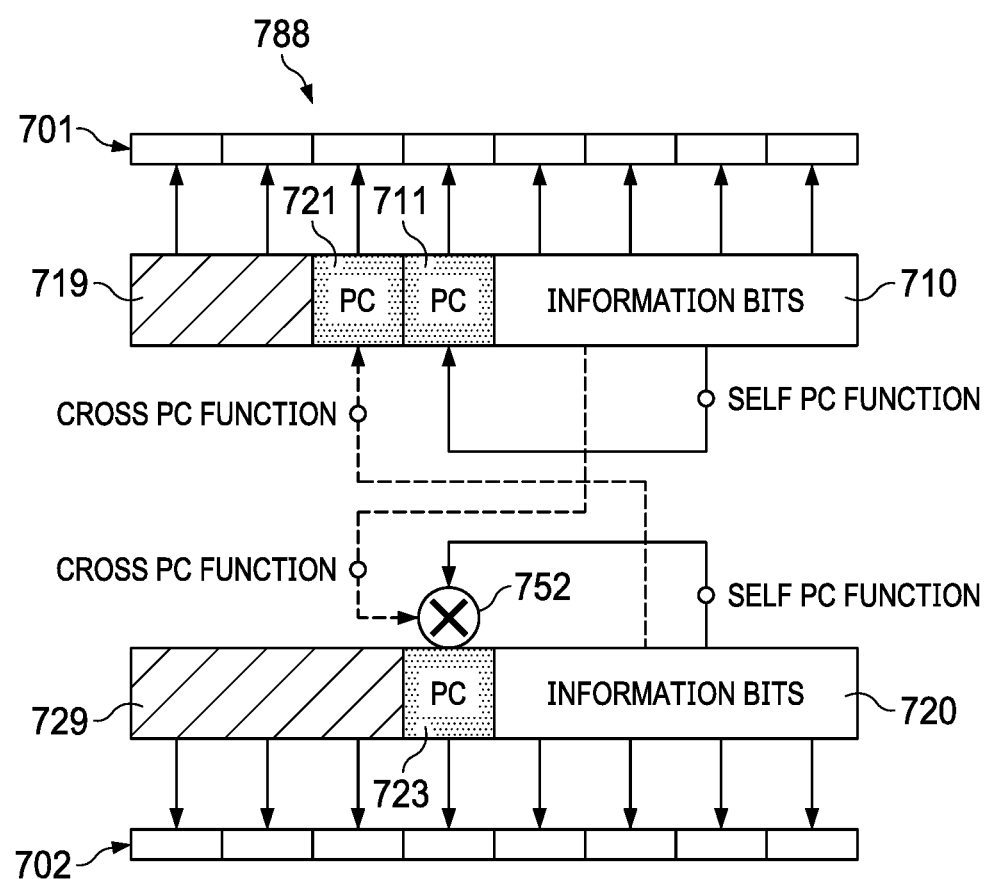

In FIG. 7H, the embodiment parallel polar encoding scheme 788 generates the masked parity bit 723 in the same manner as the embodiment parallel polar encoding scheme 785. Additionally, the embodiment parallel polar encoding scheme 788 generates the parity bit 711 directly from the segment of information bits 710 according to a self parity check function, and the parity bit 721 directly from the segment of information bits 720 according to a cross parity check function. Thereafter, the parity bits 721, 711 are transmitted over the set of sub-channels 701, and the parity bit 723 is transmitted over the set of sub-channels 702. For reasons similar to those discussed above with respect to FIGS. 7C, 7D, and 7F, the received values of the parity bits 711, 721, and the masked parity bit 723 may be compared/processed by the decoder to determine whether error detection for the segment of information bits 710 and/or the segment of information bits 720 is reliable.

Figure 7I:
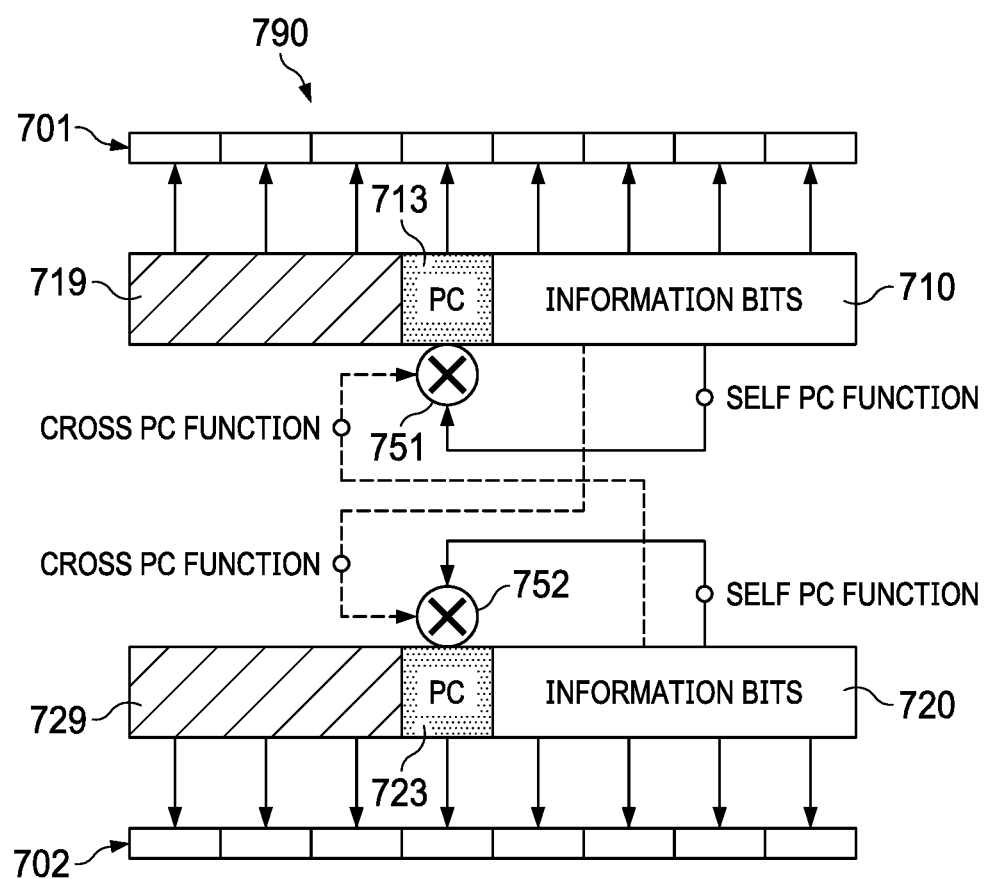

In FIG. 7I, the embodiment parallel polar encoding scheme 789 generates the masked parity bit 723 in the same manner as the embodiment parallel polar encoding scheme 785. Additionally, the embodiment parallel polar encoding scheme 788 masked parity bit 713 based on a bitwise combination 751 of a first parity bit computed directly from the segment of information bits 710 according to a self parity check function and a second parity bit computed directly from the segment of information bits 720 according to a cross parity check function.

For reasons similar to those discussed above with respect to FIGS. 7C, 7D, and 7F, the received values of the masked parity bits 713, 723 may be compared/processed by the decoder to determine whether error detection for the segment of information bits 710 and/or the segment of information bits 720 is reliable. For example, the bitwise combinations 751, 752 and self/cross parity check functions used by the embodiment parallel polar encoding schemes 789 may be configured such that the resulting masked parity bits 713, 723 are guaranteed to have the same value (or opposite values), meaning that the received values of the masked parity bits 713, 723 may be compared to determine whether those bits were correctly decoded.

The cross PC functions and/or the self PC functions used by a given one of the embodiment parallel polar encoding schemes 781-789 to compute the parity bits 711-723 may rely on the same underlying parity check algorithm or different parity check algorithms.

Likewise, the bitwise combinations 751, 752 used by the embodiment parallel polar encoding schemes 789 may use the same bitwise operation, or the same combination of bitwise operations, to compute the masked parity bits 713, 723. Alternatively, the bitwise combinations 751, 752 used by the embodiment parallel polar encoding schemes 789 may rely on different bitwise operations, or different combinations of bitwise operations, to compute the masked parity bits 713, 723.

Figure 8:
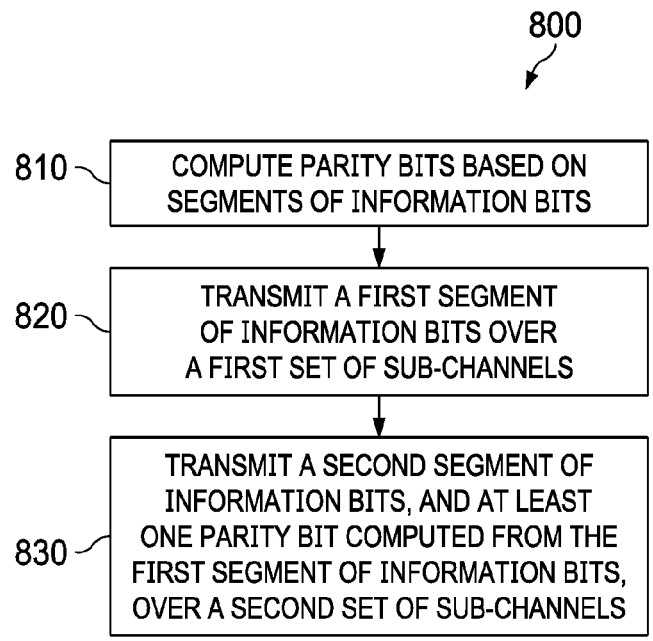
FIG. 8 is a flowchart of an embodiment method for encoding and transmitting parallel polar encoded data streams having polarity bit cross-concatenation.

FIG. 8 is a flowchart of an embodiment method 800 for encoding and transmitting parallel polar encoded data streams having polarity bit cross-concatenation, as may be performed by a transmitting device. At step 810, the transmitting device computes parity bits based on segments of information bits. At step 820, the transmitting device transmits a first segment of information bits over a first set of sub-channels. At step 830, the transmitting device transmits a second segment of information bits, and at least one parity bit computed from the first segment of information bits, over a second set of sub-channels.

Figure 9:
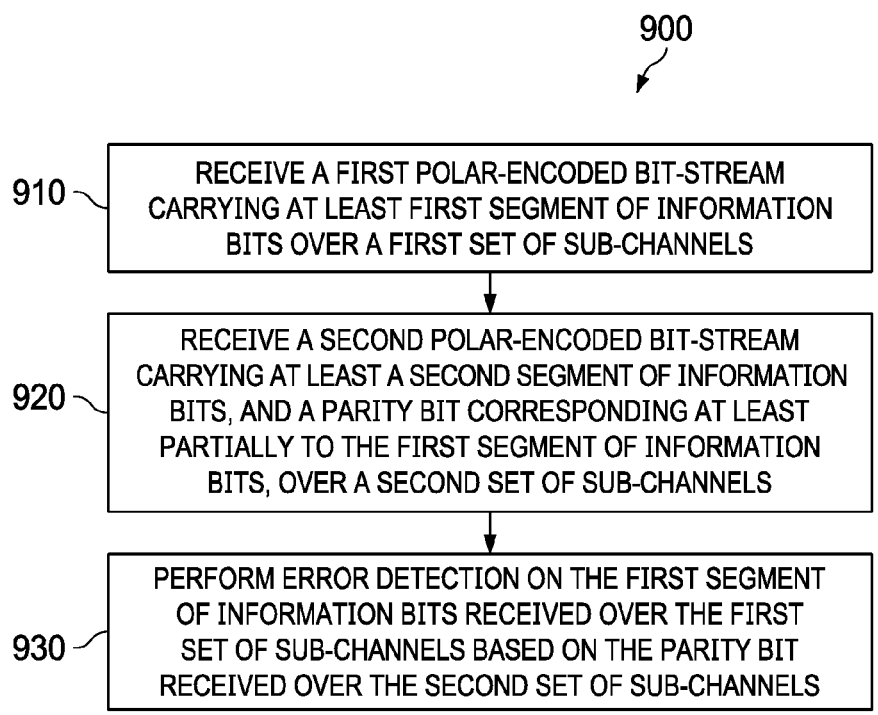
FIG. 9 is a flowchart of an embodiment method for receiving and decoding parallel polar encoded data streams having polarity bit cross-concatenation.

FIG. 9 is a flowchart of an embodiment method 900 for receiving and decoding parallel polar encoded data streams having polarity bit cross-concatenation, as may be performed by a receiving device. At step 910, the receiving device receives a first polar-encoded bit-stream carrying at least first segment of information bits over a first set of sub-channels. At step 920, the receiving device receives a second polar-encoded bit-stream carrying at least a second segment of information bits, and a parity bit corresponding at least partially to the first segment of information bits, over a second set of sub-channels. At step 930, the receiving device performs error detection on the first segment of information bits received over the first set of sub-channels based on at least the parity bit received over the second set of sub-channels.

Parallel polar encoding provides latency improvement. Chained polar codes are used to enable parallel encoding/decoding to use shorter polar codes, but still achieve similar BLER performance, as a longer polar code. In various embodiments parity check bits/functions are constructed both within and across code segments in order to improve performance.

In various embodiments, each parallel segment of the parallel polar code comprises a parity function within the segment and a parity function between the parallel segment and other parallel segments. In various other embodiments the parallel segments are parallel polar encoded and parallel polar decoded. In various embodiments self-check parity bits and cross-check parity bits co-exist in one of the parallel polar code segments or in each of the polar code segments.

Figure 10:
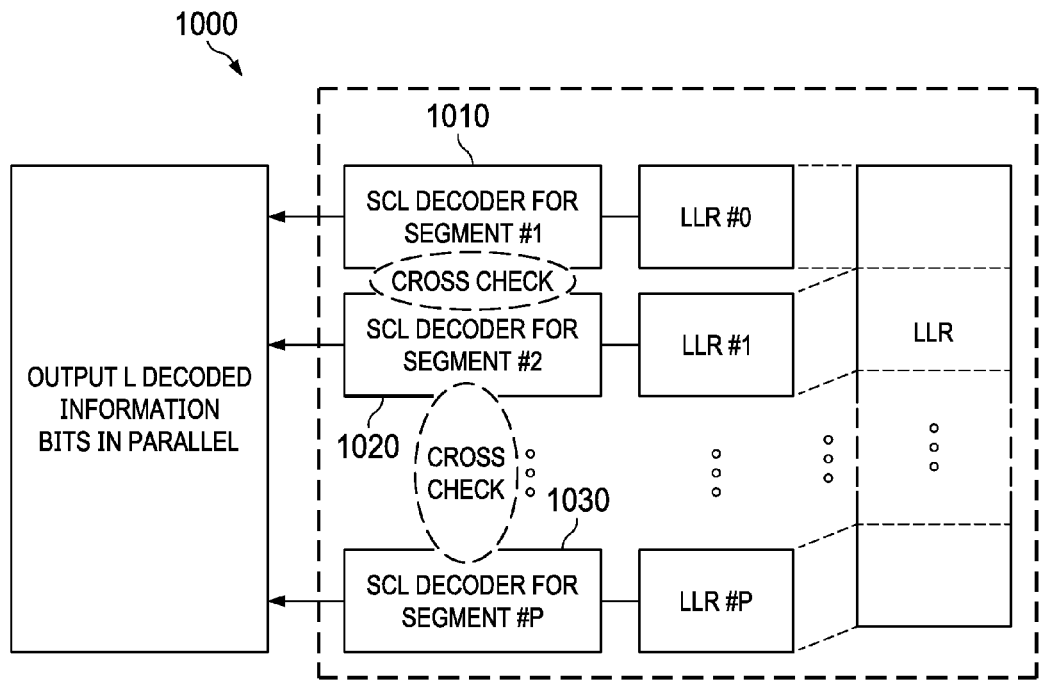
FIG. 10 is a diagram of an embodiment parallel polar decoder.

FIG. 10 is a diagram of an embodiment parallel decoder 1300 that includes P+1 individual decoders 1010, 1020, 1330 each configured to decode a segment in parallel. The individual decoders 1010, 1020, 1030 include SCL decoders and/or other types of decoders.

Figure 11:
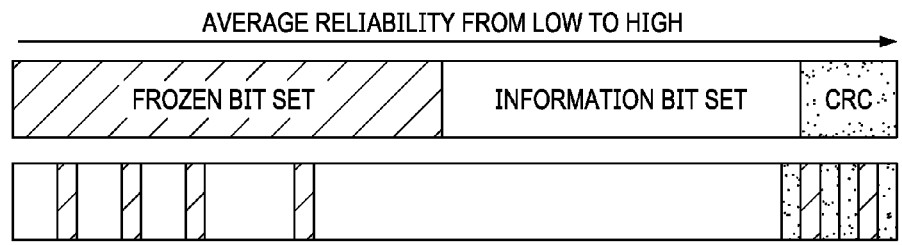
FIG. 11 is a diagram of a conventional polar code construction.

FIG. 11 is a diagram of a conventional polar code construction, in which all the bit-positions are divided into three sets: information-bit set, frozen-bit set, and CRC-bit set in terms of the polarization reliability. The frozen-bit set takes the lower reliable positions, while information-bit set and CRC-bit set take the higher reliable positions. Among many methods to yield these reliability values, the polarization weight algorithm in [1] provides a simple, SNR-irrelevant, and nested method to produce them. Note that the actual positions of these bit sets scatter over an entire code block. The CRC-bit set usually occupies the most reliable positions to help select the right path at the final stage for an error correction.

Figure 12:
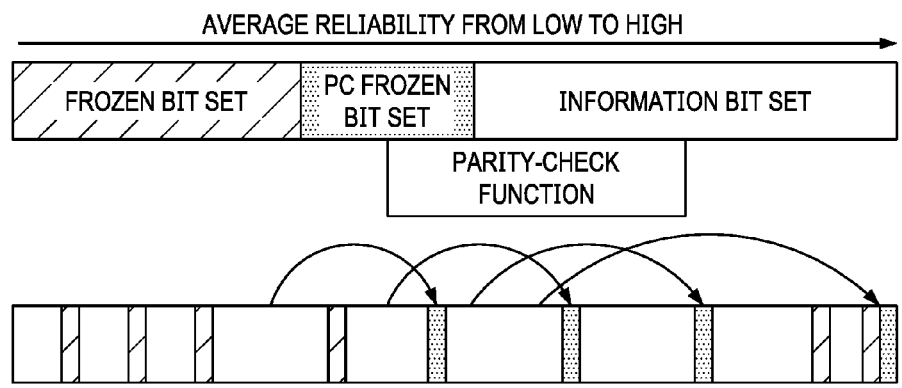
FIG. 12 is a diagram of a parity-check-enabled polar code construction.

FIG. 12 is a diagram of a PC (parity-check)-enabled polar code construction, in which a sub-set of the frozen-bit set is selected as "PC-(Parity-Check)-frozen-bit set" over which a PC(parity-check) function is set up for an error correction: at each parity-check bit position, all the previously decoded bits involving into the parity-check function over this bit would help prune the list decoding tree along with a SC (successive-cancellation) decoding path. So these paths with some wrongly decoded bits are more likely to be eliminated on the fly. Obviously, the parity-check function must be forward-only to be consistent with any SC-based decoder.

Figure 13:
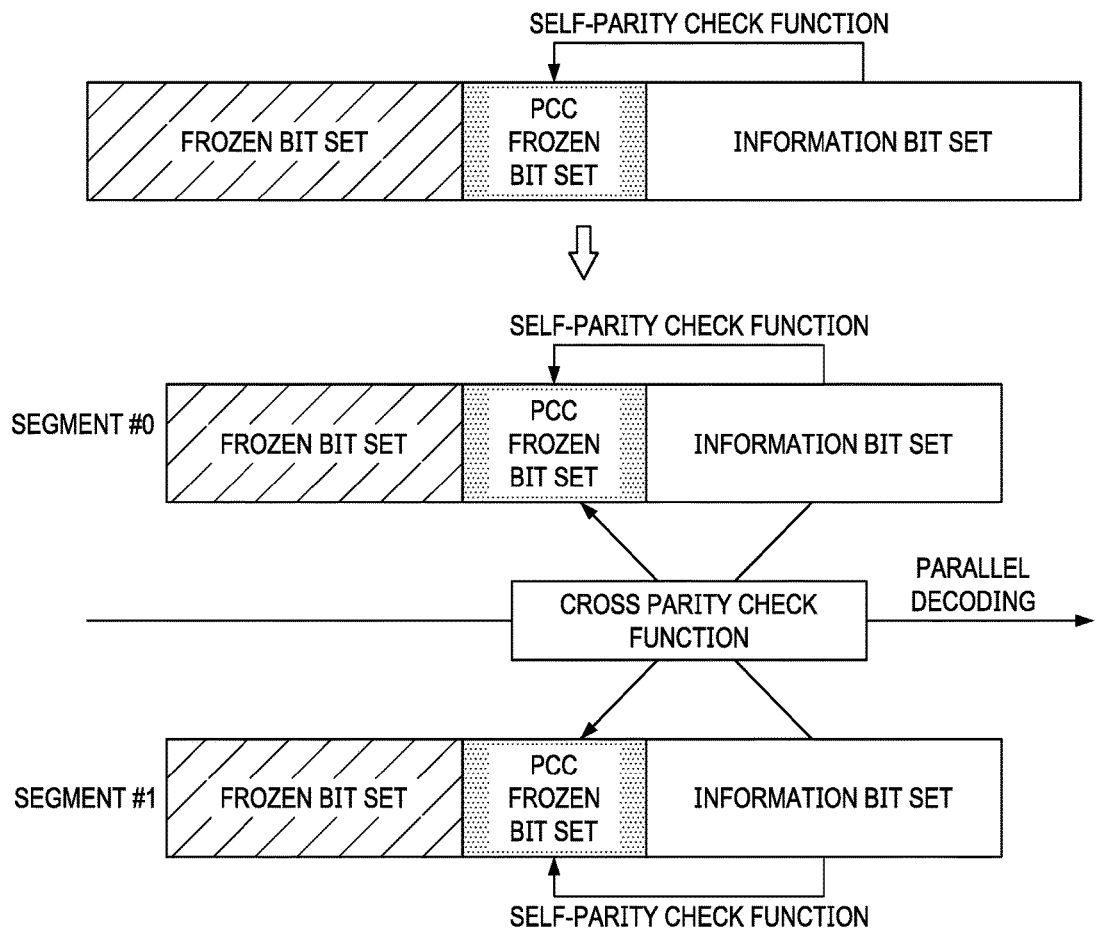
FIG. 13 is a diagram of a non-segmented polar code block being broken up into a plurality of parallel segments.

As used herein, K refers to information bits length, M refers to code block length, N refers to mother code block length, equal to $2^{\lceil log_2(M) \rceil}$, L refers to list size of SCL decoder, R refers to code Rate (K/M), R' refers to mother code rate (K/N), Q refers to an ordered sequence, P refers to puncture-set, and m refers to the number of the segments FIG. 13 is a diagram of a non-segmented polar code block being broken up into a plurality of parallel segments. The non-segmented polar code block includes parity-check bits/a parity-check function. The non-segmented polar code may already be grouped into a frozen bit set, a dynamic frozen bit (or parity-check-bit) set and an information bit set. The segments (Segment #0, Segment #1, Segment #n−1) are configured to be parallel encoded with polar encoding at the encoder and parallel polar decoded in a decoder. Each segment comprises a frozen bit set, a dynamic frozen bit set and an information bit set. Each segment comprises self-parity check bits and cross-parity check bits. The self-parity check bits check the parity within a segment and the cross-parity check bits check parity across the different segments. The cross-parity check bits may check cross-parity between all the parallel segments or only of a subset of the segments.

Figure 14:
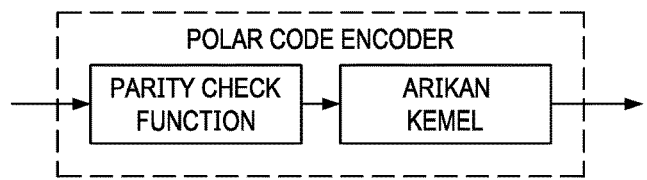
FIG. 14 is a diagram of an Arikan polar encoder with a parity check function.

FIG. 14 is a diagram of an Arikan polar encoder with a parity check function. The parity check function may be a self or cross parity check function.

When the parity check function is a self parity check function, the parity check function may perform three steps. The first step is to check out an order sequence of the reliability (Q) and determine the punctured-bit set (P) in the method provided in [1], given a R and K. The second step is to determine the frozen-bit set, PC-frozen-bit set, and information-bit set from this Q sequence. This step may include the following substeps. (i) Given a Q sequence (ordered by an ascending reliability) by Step#1, we naturally divide them into three subsets, (N−M)-subset, (M−K)-subset, (K)-subset: (ii) Find the least row-weight in the (K)-subset and denote it as $d_{min}$, where the row-weight is the number of "ones" in the row of the bit positions (sub-channels) of its Kronecker matrix. And then count n as the number of bit positions in the (K)-subset with the same row-weight as $d_{min}$. (iii) Compute $F_p$=ceil(Log$_2$(N*K)/2) and Pre-flag PC-frozen bits. If n<$F_p$, select and flag ($F_p$+n)/2 sub-channels with row-weight $d_{min}$ according to descending reliability order as frozen bits; also select and flag ($F_p$−n)/2 sub-channels with row-weight 2×$d_{min}$ according to descending reliability order as PC-frozen bits. If n≥$F_p$, select and flag $F_P$ sub-channels with row-weight $d_{min}$ according to descending reliability order as PC-frozen (iv) Determine the position for information, PC-frozen and frozen bits. This sub-step may include the following components (a) select the information bit positions one by one from the rightmost to the leftmost (in a reliability descending order) skipping the flagged bit positions, until the number of the information bit positions reaches K. (b) Flag the remaining bit positions to be the frozen bits firstly. (c) select from the frozen bit positions that have a row-weight equal to PC-frozen bits (Pre-flag in step 2.3) as additional PC-frozen bits. (d) According to the information, PC-frozen and frozen bits set, prepare the bits sequence {$a_0$, $a_1$ , , , $a_{N-1}$} for encoding, insert the K information bits into it and mark the PC-frozen and frozen bits. The third step is to apply a parity-check function over the PC-frozen-bit set prior to encoding them.

A cyclic shift on a register with length of a prime value is used for the parity check function. Assume {$a_0$, $a_1$ , , , $a_{N-1}$} is the bit sequence obtained in Step 2. The cyclic shift register may operate as follows: (1) Initialize a p-length cyclic shift register, y[0], ..., y[p−1], to 0 (2) for i=0 to N−1, read the i-th bit, $a_i$; and cyclic left shift the register based on $a_i$. If $a_i$ is an information bit: the bit is unchanged, update y[0]=($a_i$ XOR y[0]). If $a_i$ is a PC-frozen bit, set $a_i$=y[0]. If $a_i$ is a frozen bit: set $a_i$=0.

Figure 15:
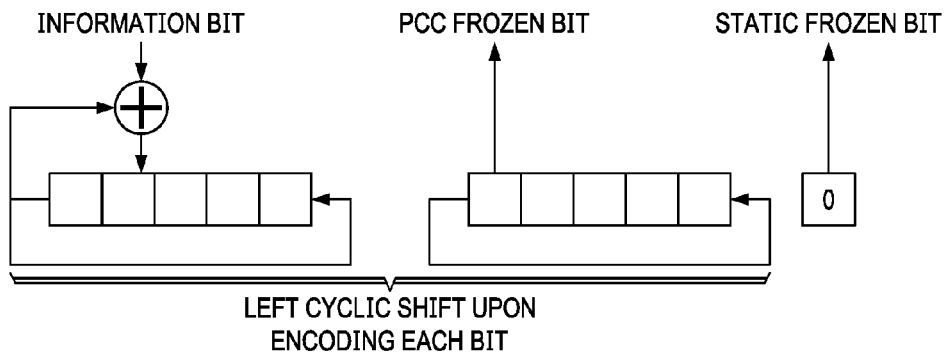
FIG. 15 is a diagram of cyclic shift register operations.

FIG. 15 is a diagram of cyclic shift register operations. A PC (parity-check)-SCL decoder used for decoding is described. The cyclic shift register operation at the decoder is the same as the encoding procedure. In one example, a parity-check matrix W is generated for the parity-check-enabled polar codes. The code block length is N=16, and the information bit length is K=8. Using the polarization weight method, the reliability of sub-channels may be ordered as follows [$u_0$, $u_1$, $u_2$, $u_4$, $u_8$, $u_3$, $u_5$, $u_6$, $u_9$, $u_{10}$, $u_{12}$, $u_7$, $u_{11}$, $u_{13}$, $u_{14}$, $u_{15}$]. In this example, the minimum weight dmin of sub-channels [$u_9$, $u_{10}$, $u_{12}$, $u_7$, $u_{11}$, $u_{13}$, $u_{14}$, $u_{15}$] is 4, and the number of them is n=3. By definition, Fp=ceil(Log 2(N*K)/2)=4, and n<Fp. Therefore, the method selects floor((Fp+n)/2)=3 sub-channels with weight dmin=4 and floor((Fp−n)/2)=0 sub-channels with weight 2*dmin=8 as PC-frozen bits. By descending polarization weight order, these frozen bits are [$u_9$, $u_{10}$, $u_{12}$]. Then, the information and additional frozen bits are mapped according to descending polarization order. The information-bit set is [$u_3$, $u_5$, $u_6$, $u_7$, $u_{11}$, $u_{13}$, $u_{14}$, $u_{15}$] and the frozen-bit set is [$u_0$, $u_1$, $u_2$, $u_4$, $u_8$, $u_9$, $u_{10}$, $u_{12}$]. By selecting the frozen bits with weight 4, the PC-frozen-bit set as set as [$u_9$, $u_{10}$, $u_{12}$]. A prime-length cyclic register with p=5 is used to build parity functions for each PC-frozen bit in [$u_9$, $u_{10}$, $u_{12}$]. For $u_9$, the parity function would be [$u_4$, $u_9$], and since $u_4$ is a frozen bit and will not engage in the XOR operation in the cyclic register, $u_9$ also becomes a static frozen bit. For $u_{10}$ and $u_{12}$, the parity functions are [$u_5$, $u_{10}$] and [$u_7$, $u_{12}$], where $u_5$ and $u_7$ are information bits.

Figure 16:
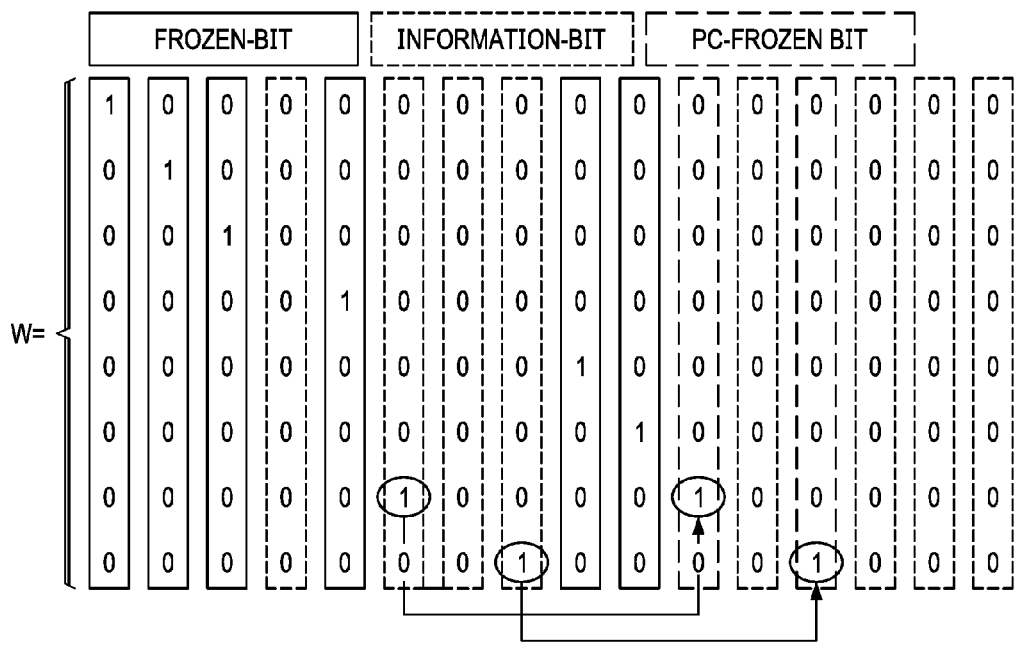
FIG. 16 is a diagram of a parity check matrix.
Figure 17:
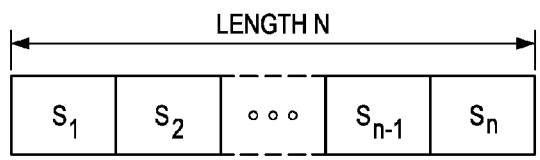
FIG. 17 is a diagram of a segmented polar code.
Figure 18:
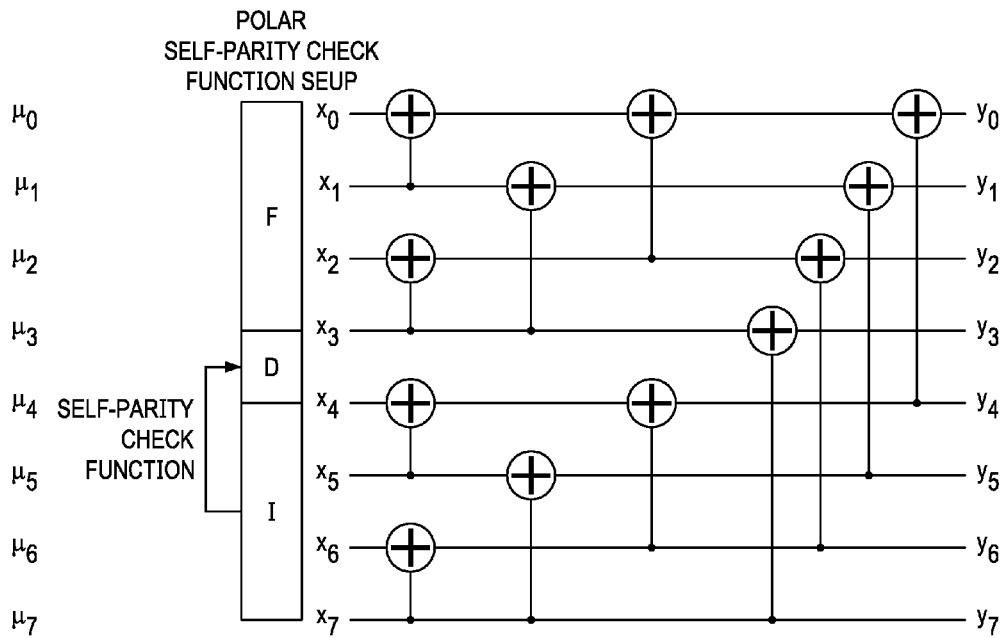
FIG. 18 is a diagram of a technique for transforming a non-segmented polar code block into a parity checked non-segmented polar code block.

FIG. 16 is a diagram of a parity check matrix constructed using the above-described method. From W we obtain 0=$u_0$=$u_1$=$u_2$=$u_4$=$u_8$=$u_9$ as Frozen bits, $u_0$ and $u_{12}$ as PC-frozen bits with the self-parity-check functions being $u_{10}$=$u_5$, $u_{12}$=$u_7$. FIG. 17 is a diagram of an embodiment decoding segmentation technique. FIG. 18 is a diagram of a non-segmented polar code with a parity-check function. The u vector consists of the information bits and frozen bits that are put onto the information-bit set and frozen-bit set. Then some parity-check bits are computed and put onto the PC-frozen set to form a vector x. After multiplied by a N-dimension Kronecker matrix, the coded bit vector is y. At a decoding side, a SC-based decoder will recover the u vector one bit after another.

Figure 19:
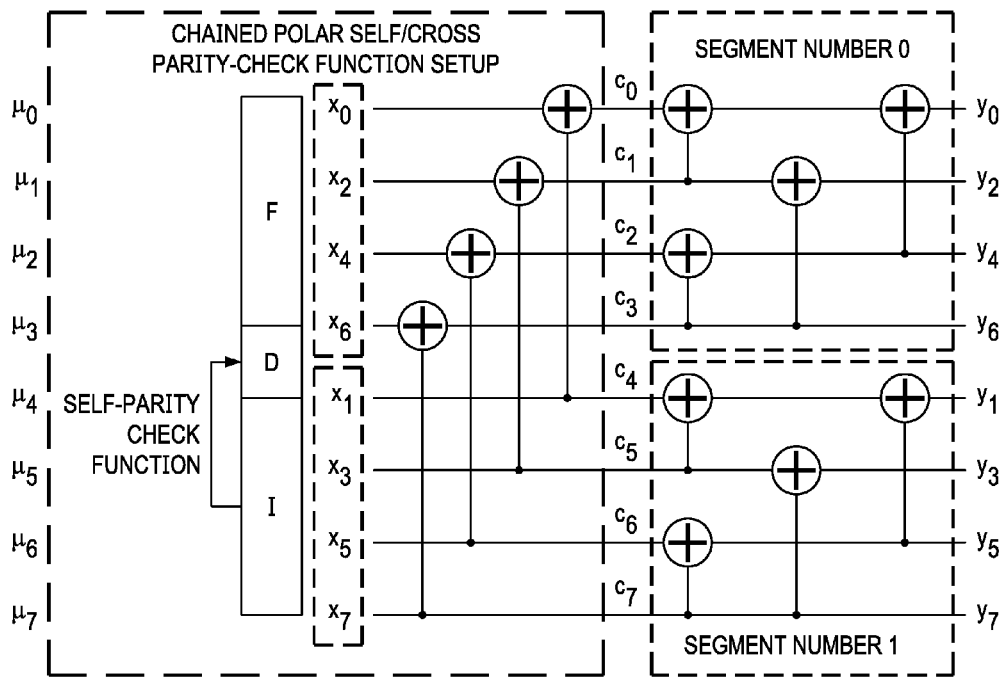
FIG. 19 is a diagram of a technique for transforming a non-segmented polar code block into a plurality of parallel segments, wherein the segments comprise self-parity-checked bits and cross-parity-checked bits.
Figure 20:
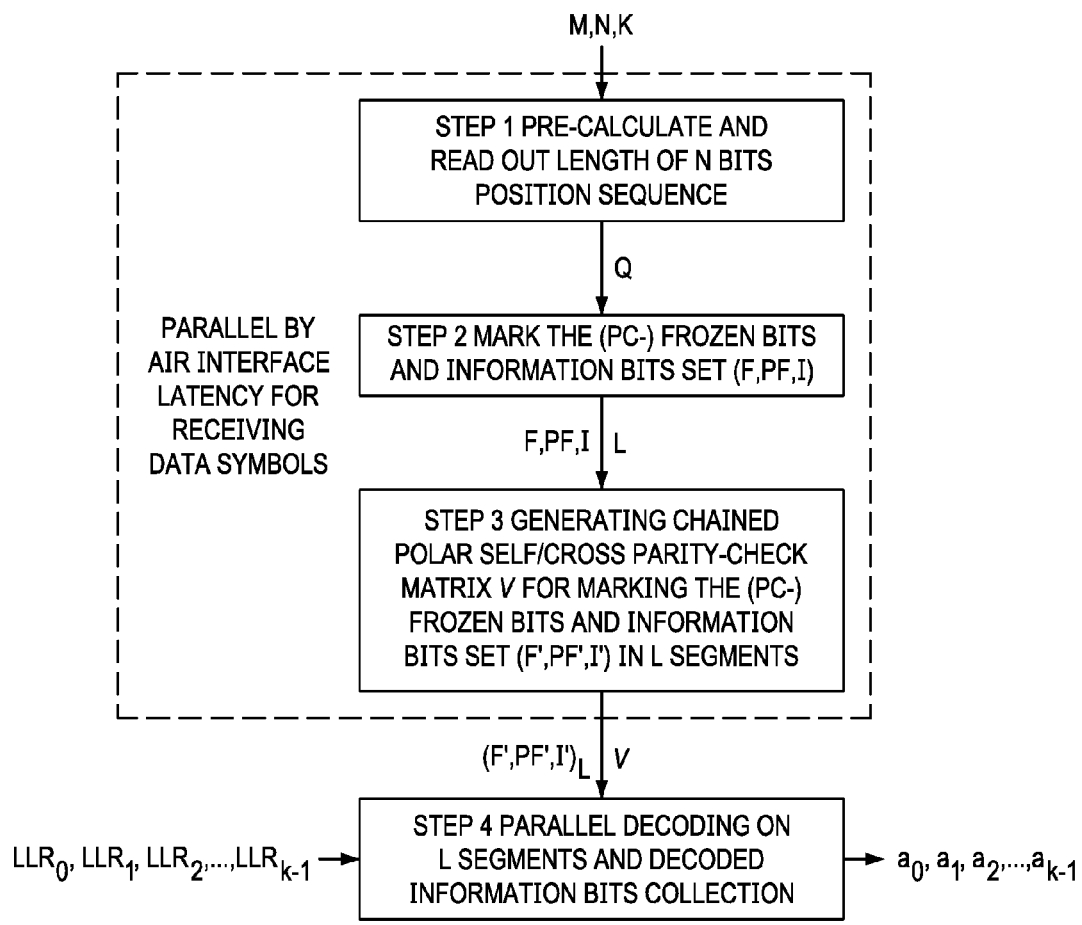
FIG. 20 is a flowchart of an embodiment decoding segmentation procedure.

FIG. 19 is a diagram of a dual segment polar code with a parity-check function. If an encoder permutes the vector x as in FIG. 19, then the decoder can be segmented into two parts from the $c_0$, $c_1$, ..., $c_{N-1}$. Each segment can have its own decoder, channel LLRs inputs, (self-)-parity-check, and chained with each other by a cross-parity-check (splitting from the parity-check). The constraints over the $c_0$, $c_1$, ..., $c_{N-1}$ are derived from the x, which enables the information bits (u) to be recovered from the decoded bits of the two separated parallel decoders. FIG. 20 is a flowchart of an embodiment decoding segmentation procedure. In Steps #1 and #2 are used to generate the Frozen bits position set, PC-frozen bits position set, and Information bits position set (F, PF, I) given a (M, N, K). Step 3 is used to generate a parity-check matrix V and segmented (F', PF', I') for each segment from the non-segmented W and from step 2.

Figure 21:
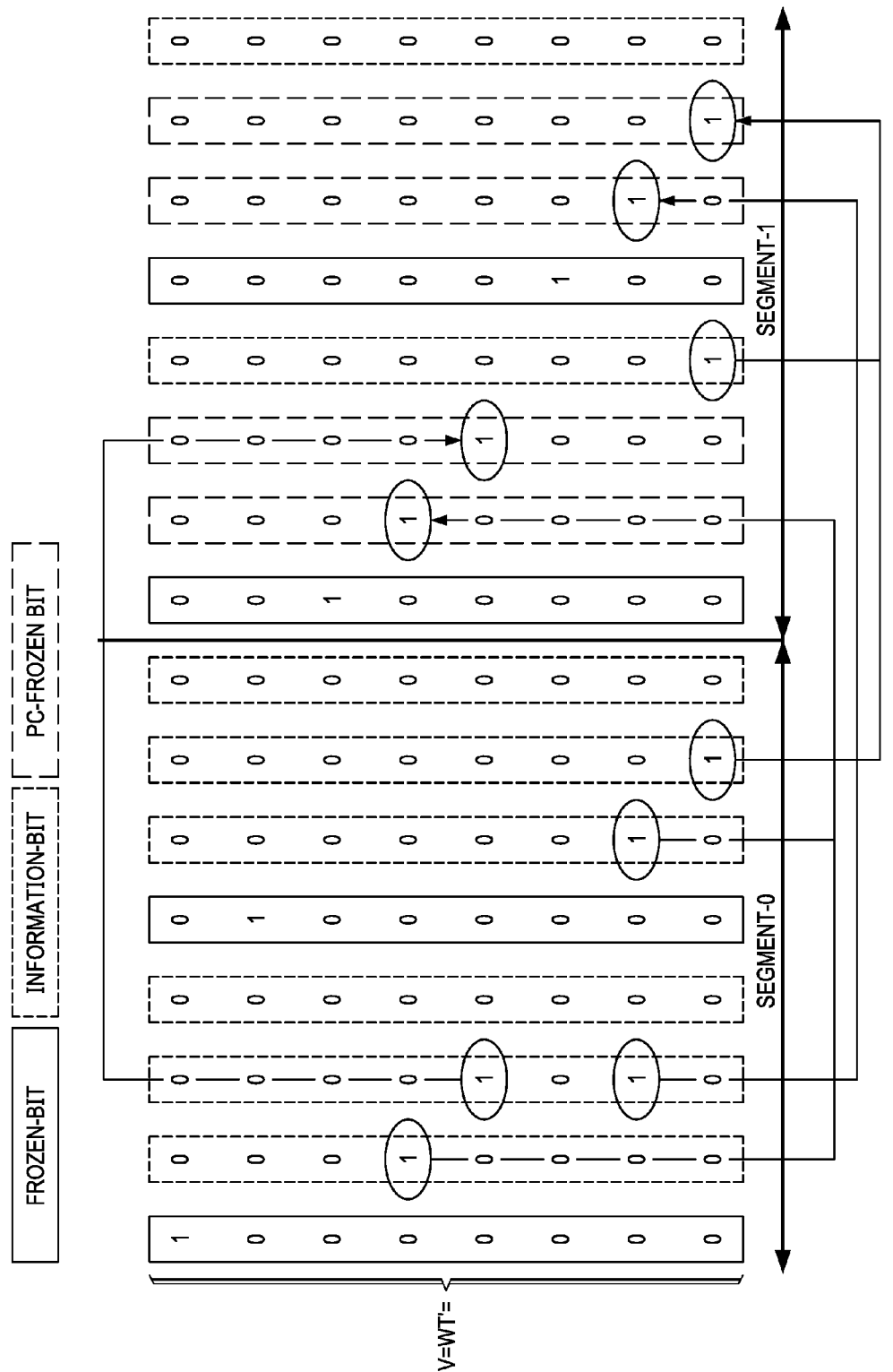
FIG. 21 is a diagram of an embodiment cross-parity check matrix.

FIG. 21 is a diagram of a Dual-Segmented Decoder. We give an example for generating the parity-check matrix V for the chained polar codes for m=2 (dual)-segmentation. Since $c_0$, $c_1$, ..., $c_{N-1}$ is the result of one-step polarization of $x_0$, $x_1$, ..., $x_{N-1}$ with permutations, we define the transformation matrix as T=Permute(kron(I, G)), that is, the kronecker product of the identity matrix I and Polar code kernel $$G = \begin{bmatrix} 1 & 0 \\ 1 & 1 \end{bmatrix},$$

and permuting the rows. The permutation is to rearrange the order of $x_0$, $x_1$, ..., $x_{N-1}$, which is [1, 3, 5, ..., N−1, 2, 4, 6, ..., N] for the two-segment case. Multiplying the transformation matrix T with the original parity-check matrix W, we obtain the parity-check matrix for the chained polar codes as From V, 0=$c_0$=$c_4$=$c_8$=$c_{12}$ are mapped to Frozen bits, and $c_9$, $c_{10}$, $c_{13}$ and $c_{14}$ are mapped to cross-parity-check PC-frozen bits with cross-parity-check functions being $c_9$=$c_1$, $c_{10}$=$c_2$, $c_{13}$=$c_2$+$c_5$, and $c_{14}$=$c_6$+$c_{11}$ for the chained polar code. Here, $c_0$, $c_1$, ... $c_7$, belongs to the first segment, and $c_8$, $c_9$, ... $c_{15}$ belong the second segment. By chance, there is no self-parity-check for this example. It should be appreciated that V includes the self-parity-check points and functions and cross-parity-check points and functions in general.

In step 4, the received N soft bits value (LLR) are separated into m segments for parallel decoding like FIG. 1. The output of the parallel decoder is the partial sum of original information, i.e., $c_0$, $c_1$, ..., $c_N$. Then, a one-step polarization processing the decoded bits $u_0$, $u_1$, ..., $u_N$ is performed.

For a parallel polar decoder structure, m instances of PC-SCL decoder are implemented and work in parallel. The parity check matrix V from Step #3 for the cross-check and self-check are used in the parallel decoding process. At each decoding step, each PC-SCL decoder extends the paths and computes the path metrics independently. The path metrics of the paths that satisfy the cross-checks between different PC-SCL decoders are exchanged and combined, i.e., the paths belonging to different PC-SCL decoders are bound when their cross-checks are satisfied and the paths that violate the cross-checks are safely killed. After that, each PC-SCL decoder does path sort and prune in full parallel. And by the output decision at final stage, we can get two decoded bits in parallel.

Since the decoding steps are decreased from N to N/m, the decoding latency is reduced. Further, the construction is based on the long code, ensuring that the performance of the parallel decoder can approach that of the long polar code. The proposed parallel decoder is easier to implement, as the log-likelihood and path metric are updated independently in each PC-SCL decoder corresponding to the segments.

Figure 22A:
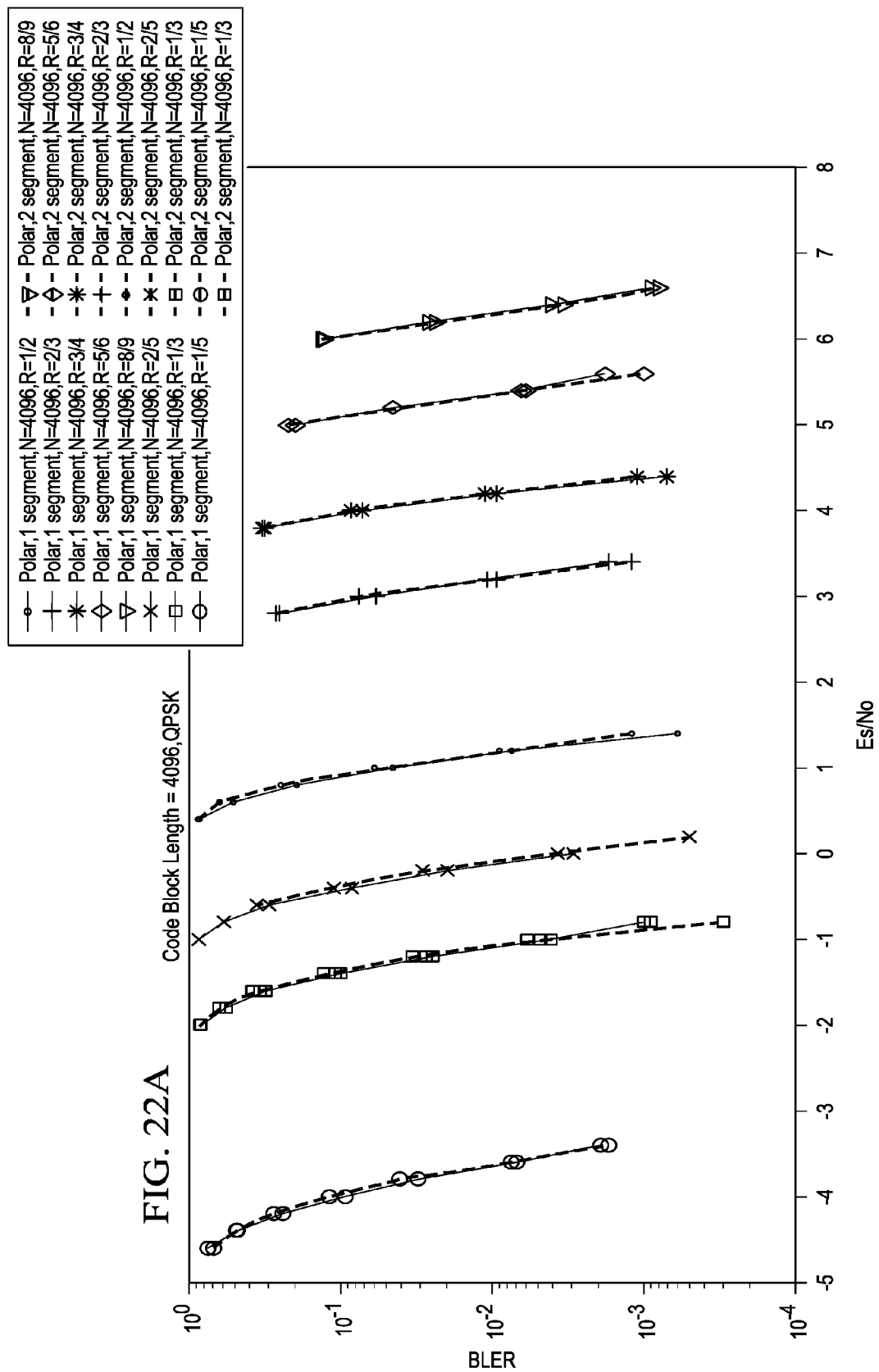
FIGS. 22A and 22B are graphs showing the block error rate performance of segmented polar codes over a range of transmitted signal energy per symbol to noise spectrum density ratios.

FIGS. 22A and 22V show the performance of chained polar codes with two segments. The encoding and parallel decoding method mentioned in section 2 was used.

Figure 22B:
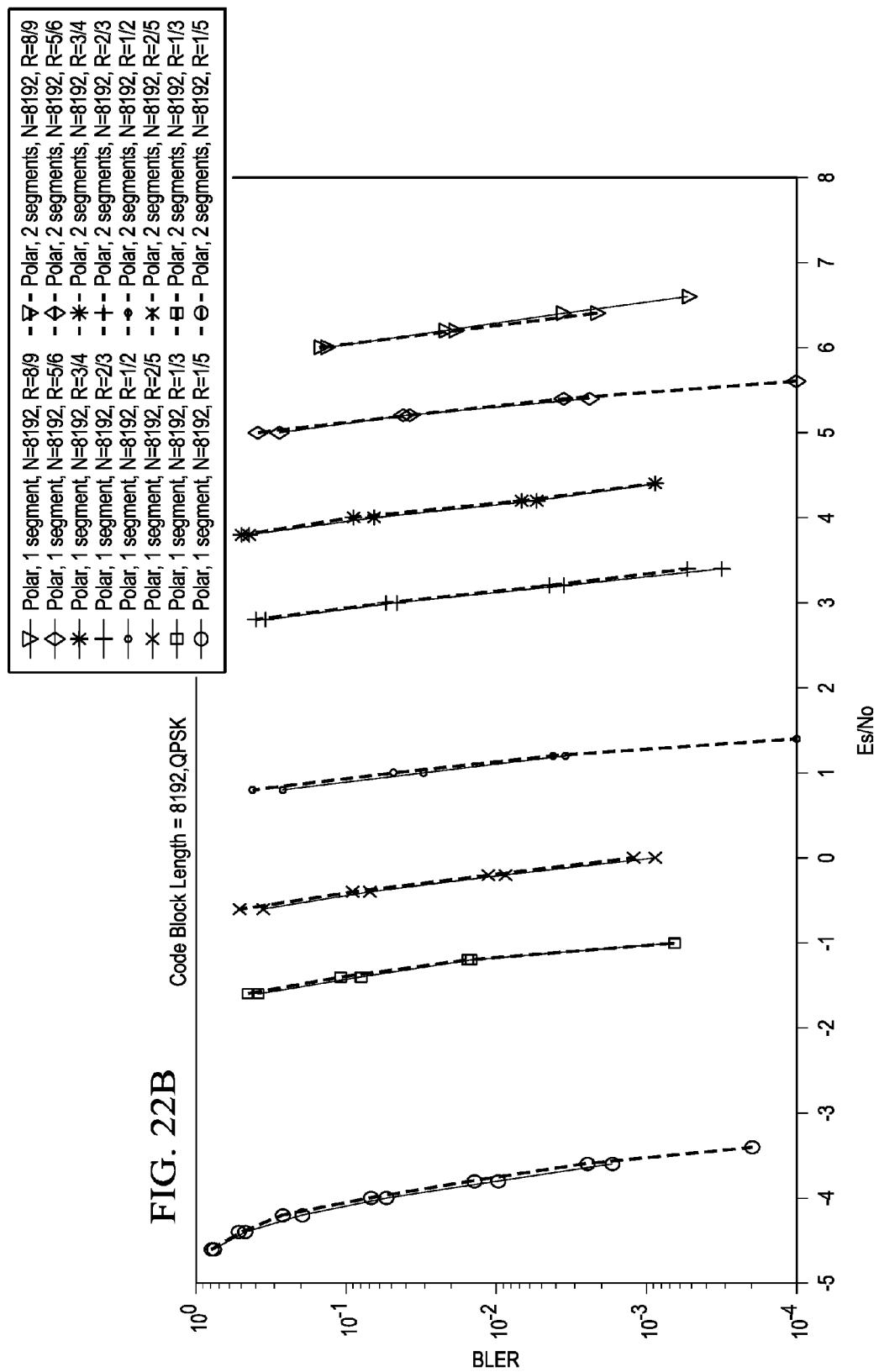

FIGS. 22A-22B show the performance of the segmented parity checked polar code according to embodiments. FIG. 22A shows the performance of a plurality of codes with a code block length N of 4096 and list size 32 via QPSK modulation. The performance of the segmented parity checked polar code according to embodiments is compared to other codes. In FIGS. 22A, 22B, the graphs show a block error rate (BLER) over Es/No (channel bits or symbols after encoding). FIG. 22B shows the performance of a plurality of codes with a code block length N of 8192 and list size 32 via QPSK modulation. The performance of the segmented parity checked polar code according to embodiments is compared to other codes.

Figure 23A:
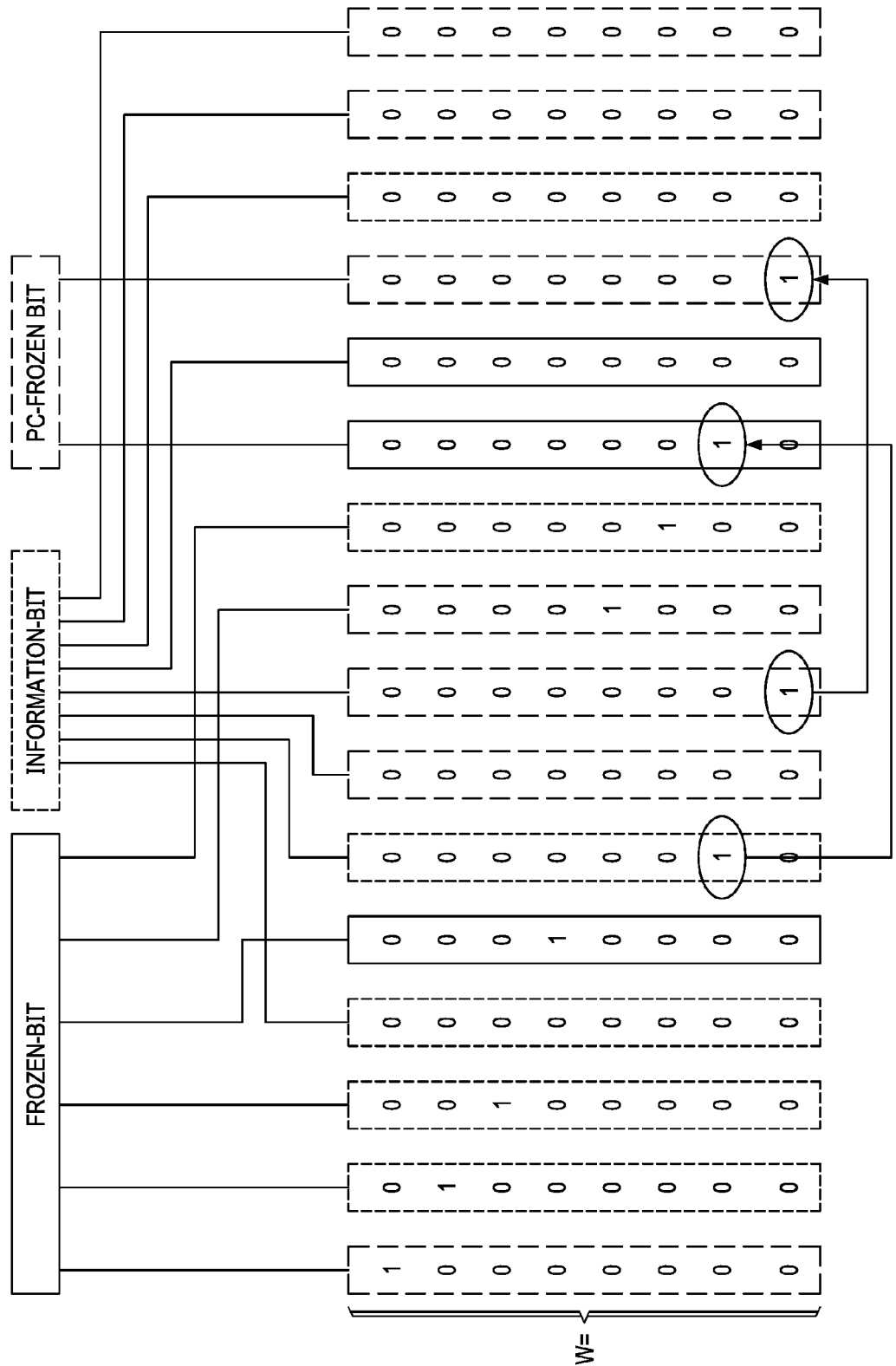
FIG. 23A s is a diagram of an embodiment self-parity check matrix.

FIG. 23A shows applying a self-parity-check function (parity-check matrix) to a non-segmented polar code block. Applying the parity-check matrix to the non-segmented polar code block leads non-segmented polar code block comprising parity-check bits (or a parity-check function). The parity-checked non-segmented polar code block comprises a frozen bit set, a dynamic frozen bit set and an information bit set. Applying a parity-check function on the polar code block can be described as applying a parity-check matrix W to a vector u. Applying the parity-check matrix W to the vector u computes parity-check bits that are assigned to a frozen bit set. In an embodiment, an obtained parity-check matrix W may be found in FIG. 23A. The resulting vector x includes the frozen bit set, the information bit set and parity-check-bit set. After multiplying the vector x with a coding matrix such as an N-dimension Kronecker matrix, the resulting vector y (coded bit vector) is provided. At the decoder, a SCL (successive cancellation list)-based decoder may recover the u vector on a bit-by-bit basis.

Figure 23B:
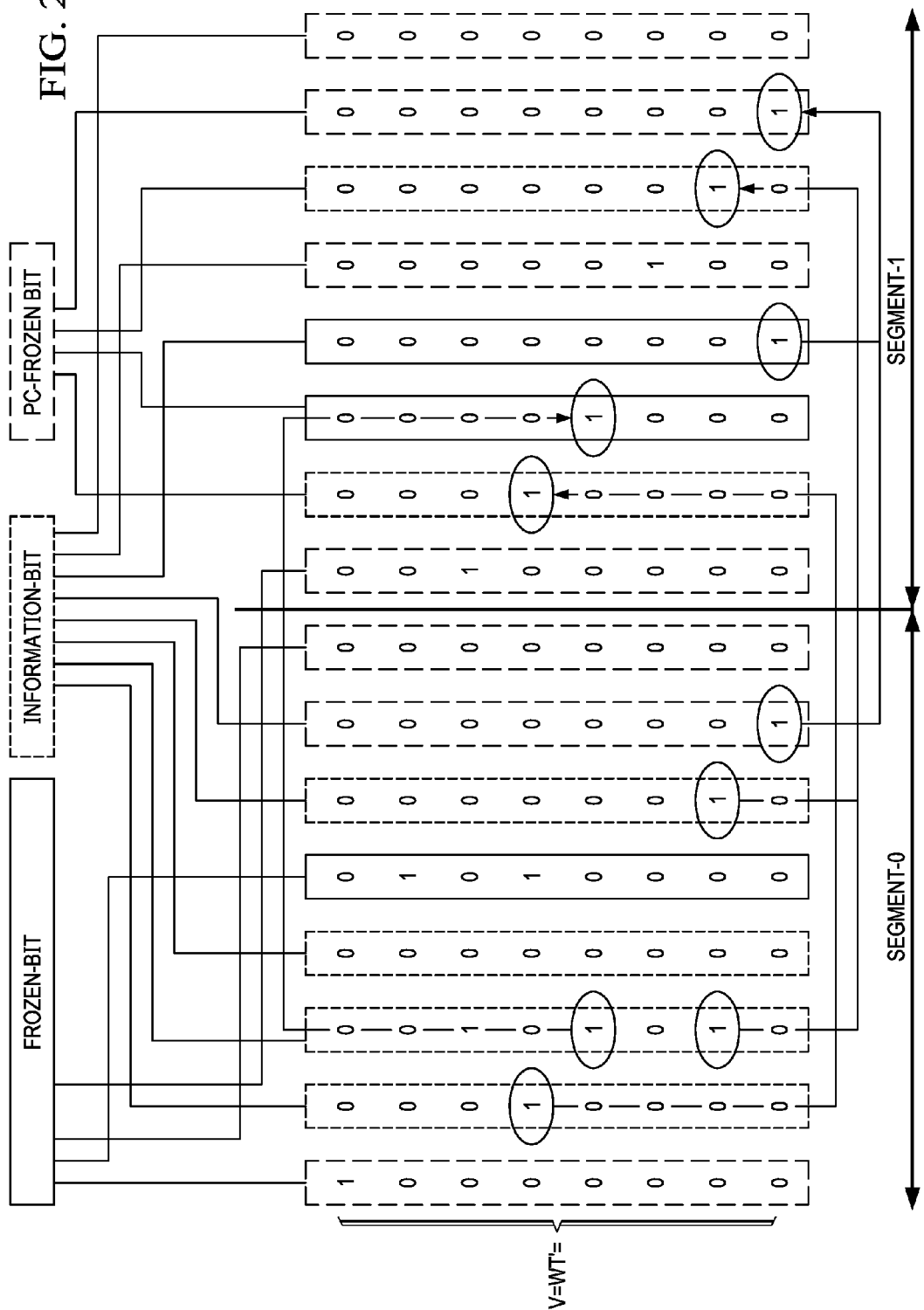
FIG. 23B is a diagram of an embodiment cross-parity check matrix.

FIG. 23B shows applying a self-parity-check function (parity-check matrix), a cross-parity check function and segmentation to a non-segmented polar code block. Applying the parity-check matrix to the non-segmented polar code block leads to a non-segmented polar code block comprising parity-check bits (or a parity-check function). The parity-checked non-segmented polar code block comprises a frozen bit set, a dynamic frozen bit set and an information bit set. Applying a parity-check function on the polar code block can be described as applying a parity-check matrix W to a vector u. Applying the parity-check matrix W to the vector u computes parity-check bits that are assigned to a frozen bit set. The resulting vector x includes the frozen bit set, the information bit set and parity-check bit set. A permutation is applied to the vector x so that a vector c is generated. The vector c can be described as being segmented and having cross parity check functions between the segments. When written in matrix form parity check matrix for self-parity check and cross-parity check can be written as V=WT, wherein T is the permutation matrix. After multiplying the vector c with a coding matrix such as an N-dimension Kronecker matrix, a resulting vector is y (coded bit vector) is generated. At the decoder, a SCL-based decoder (with a plurality of individual SCL decoder) may recover the u vector on a bit-by-bit basis.

According to an embodiment the permutation matrix T may be defined as T=Permute(kron (I, G)), wherein I is the identity matrix and G is a polar code kernel. For example, G=[0 1; 1 1]. The permutation may be an odd-even permutation [1, 3, 5, ..., N−1, 2, 4, 6, ..., N]. Other permutations are possible too. In an embodiment, an obtained cross parity-check matrix V=WT may be found in FIG. 12B. The frozen bits are $0=c0=c1=c8=c9$; the cross-parity-check bits are $c10$, $c12$, $c13$ and $c14$, the cross-parity check functions are $c10=c2$, $c12=c4$, $c13=c2+c5$ and $c14=c11+c6$. In this particular case, there are no self-parity check bits.

Figure 24:
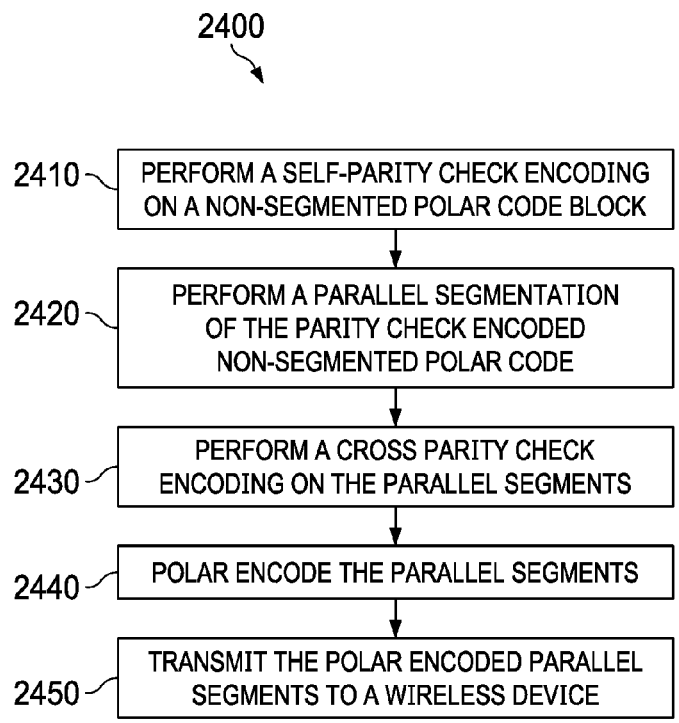
FIG. 24 is a flowchart of an embodiment method for encoding a polar code block.

FIG. 24 is a flowchart of an embodiment method 2400 for polar encoding a data block, as may be performed by an encoder. At step 2410, the decoder performs a self-parity check encoding on a non-segmented polar code block. At step 2420, the decoder performs a parallel segmentation of the parity check encoded non-segmented polar code. At step 2430, the decoder performs a cross parity check encoding on the parallel segments. At step 2440, the decoder polar encodes the parallel segments. At step 2450, the encoder, or a transmitter connected thereto, transmits the polar encoded parallel segments to a wireless device. Steps 1410-1450 can be performed in the order stated, at the same time or in another order.

Figure 25:
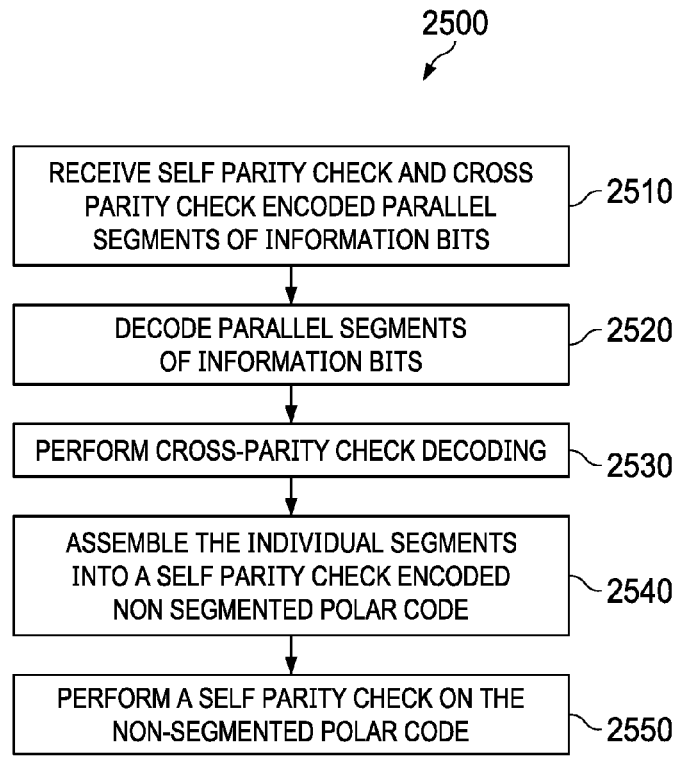
FIG. 25 is a flowchart of an embodiment method for decoding polar encoded data.

FIG. 25 is a flowchart of an embodiment method 2500 for decoding a received polar encoded signal, as may be performed by a decoder. At step 2510, the decoder receives a self parity check and cross parity check encoded parallel segments from another wireless device. At step 1520, the decoder decodes the received parallel segments. At step 2530, decoder performs cross-parity check decoding. At step 2540, the decoder assembles the individual segments into a self parity check encoded non segmented polar code. At step 2550, the decoder performs a self parity check on the non-segmented polar code. Steps 2520-2550 can be performed in the order stated, at the same time, or in another order.

Figure 26:
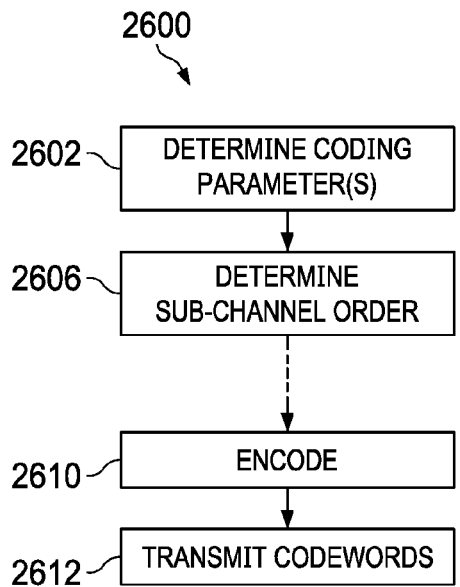
FIG. 26 is a flow diagram of an example coding method according to an embodiment.

FIG. 26 is a flow diagram of an example coding method according to an embodiment. The illustrated example method 2600 includes determining one or more coding parameters at 2602. The coding parameter(s) could include at least a mother code length N, which could be read from memory or otherwise provided. N could be computed based on a given K and a given code rate R, for example. At 2606, a reliability order of sub-channels is determined as disclosed herein. A rule set could be used to reduce the number of reliability computations and polynomial comparisons that are involved in determining sub-channel order at 2606, for example, which could make it feasible to determine sub-channel order online when information is to be encoded or decoded.

An ordered sub-channel sequence as determined at 2606 could be used to select information sub-channels, frozen sub-channels, and/or other types of sub-channels when information is to be encoded at 2610. Codewords are then transmitted at 2612.

The example method in FIG. 26 is intended for illustrative purposes. Other embodiments could involve performing the illustrated operations in any of various ways, performing fewer or additional operations, and/or varying the order in which operations are performed.

Figure 27:
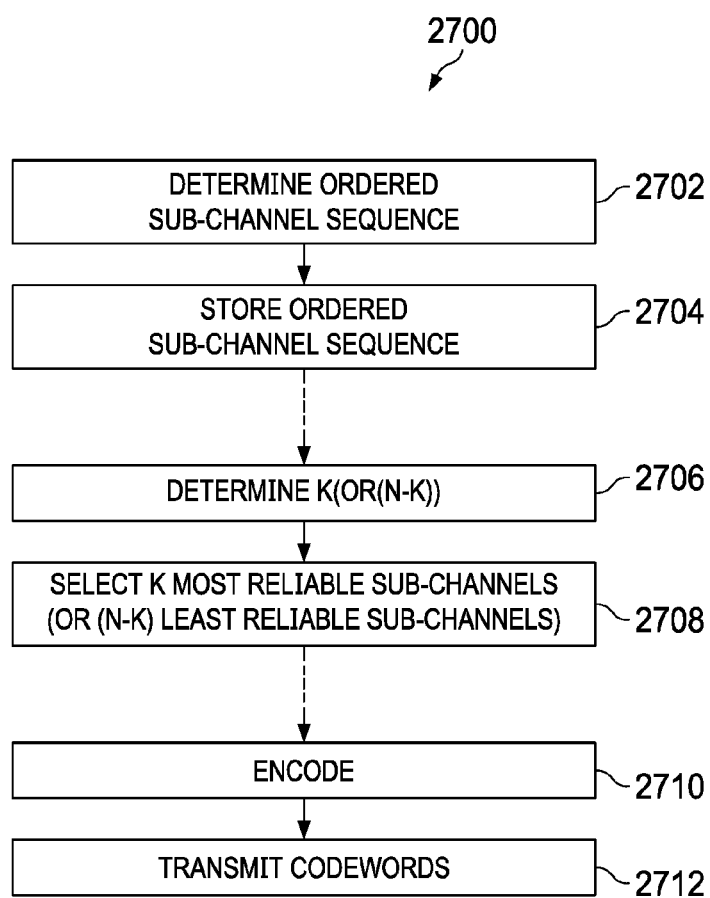
FIG. 27 is a flow diagram of an example coding method according to a further embodiment.

FIG. 27 is a flow diagram of an example of such a coding method 2700 according to a further embodiment. The example method 2700 involves determining an ordered sequence of sub-channels at 2702 and storing the determined ordered sub-channel sequence at 2704. In some implementations, these steps may be optional and/or performed in advance, separately from other coding operations in coding method 2700. For example, the coding method 2700 may instead simply include determining an ordered sub-channel sequence at 2702 by retrieving or reading the stored the ordered sub-channel sequence from memory. Other possibilities exist.

One or more coding parameters, which could include K or (N−K) depending on the type of sub-channels to be selected, is determined at 2706, and examples of operations that could be involved in determining K or (N−K) are described above. At 2708, K most reliable sub-channels, or (N−K) least reliable sub-channels, of the N sub-channels are selected. The encoding at 2710 involves encoding input bits onto the K most reliable sub-channels, according to the selection at 2708. Codewords that are generated by the encoding at 2710 are transmitted at 2702.

The example method 2700 is intended for illustrative purposes. Other embodiments could involve performing the illustrated operations in any of various ways, performing fewer or additional operations, and/or varying the order in which operations are performed. Other variations could be or become apparent to a skilled person based on the present disclosure. For example, any one or more of the following could be provided, alone or in any of various combinations, in embodiments: receiving a first polar-encoded bit-stream carrying at least first segment of information bits over a first set of sub-channels, receiving a second polar-encoded bit-stream carrying at least a second segment of information bits and a masked parity bit over a second set of sub-channels, and/or performing error detection on the first segment of information bits received over the first set of sub-channels in accordance with at least the masked parity bit received over the first set of sub-channels.

Although FIGS. 26, 27 show example operations that would be performed at an encoder (or transmitter), other embodiments could be implemented at a decoder (or receiver). A word that is based on a codeword of a code could be received at a receiver and decoded, based on sub-channels that are selected by the decoder or a sub-channel selector coupled to the decoder according to a method as shown in any of FIGS. 26, 27 and/or as otherwise disclosed herein.

In another embodiment, a non-transitory processor-readable medium stores instructions which, when executed by one or more processors, cause the one or more processors to perform a method as disclosed herein.

Figure 28:
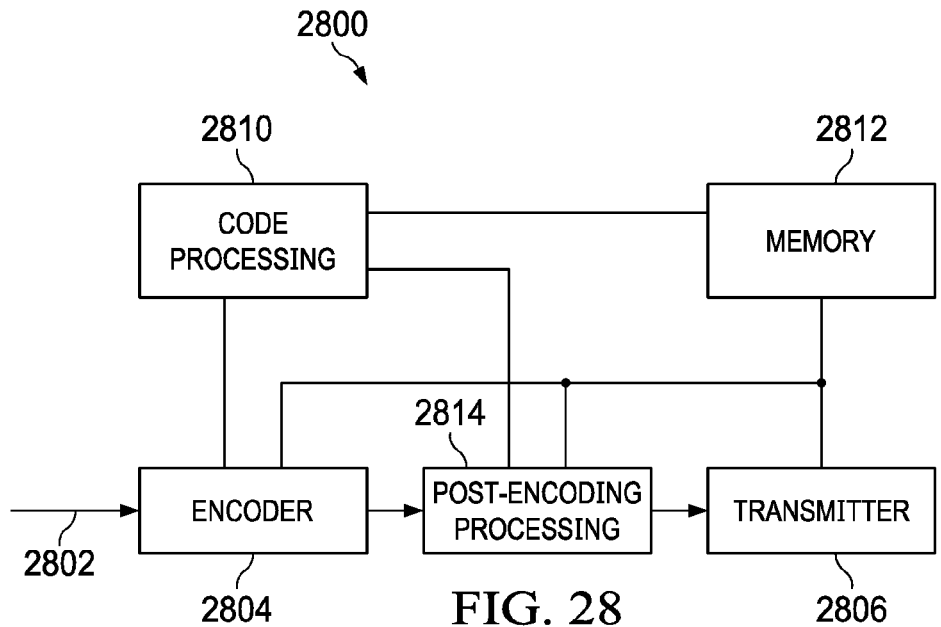
FIG. 28 is a block diagram of an apparatus for encoding and transmitting codewords.

FIG. 28 is a block diagram of an apparatus for encoding and transmitting codewords. The apparatus 2800 includes an encoder module 2804 coupled to a transmitter module 2806. The apparatus 2800 also includes a code processing module 2810 coupled to the encoder module 2804 and a post-encoding processing module 2814. The post-encoding processing module 2814 is also coupled to the encoder module 2804 and to the transmitter module 2806. A memory 2812, also shown in FIG. 28, is coupled to the encoder module 2804, to the code processing module 2810, to the post-encoding processing module 2814, and to the transmitter module 2806. Although not shown, the transmitter module 2806 could include a modulator, an amplifier, antenna and/or other modules or components of a transmit chain or alternatively could be configured to interface with a separate (Radio-Frequency—RF) transmission module. For example, some of all of the modules 2804, 2806, 2810, 2814 of the apparatus 2800 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 2812 is a non-transitory computer readable medium at 2812, that includes instructions for execution by a processor to implement and/or control operation of the code processing module 2810, the encoder module 2804, the post-encoding processing module 2814, the transmitter module 2806 in FIG. 28, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 2812.

In some embodiments, the encoder module 2804 is implemented in circuitry, such as a processor, that is configured to encode input bits as disclosed herein. The encoder module 2804 may be configured to map a first segment of information bits to sub-channels in a first set of sub-channels, map a second segment of information bits to sub-channels in a second set of sub-channels, compute at least a first parity bit based on the first segment of information bits in the first set of sub-channels and at least the second parity bit based on the second segment of information bits in the second set of sub-channels, and/or computing a masked parity bit according to a bitwise AND, a bitwise OR, or a bitwise XOR of the first parity bit and at least the second parity bit. The encoder module 2804 may also be configured to polar encode at least the first segment of information bits, and another encoder module may be configured to separately polar encode at least the second segment of information bits and the masked parity bit. In a processor-based implementation of the encoder module 2804, processor-executable instructions to configure a processor to perform encoding operations are stored in a non-transitory processor-readable medium. The non-transitory medium could include, in the memory 2812 for example, one or more solid-state memory devices and/or memory devices with movable and possibly removable storage media.

The code processing module 2810 could be implemented in circuitry that is configured to determine coding parameters such as mother code block length, and to determine an ordered sub-channel sequence as disclosed herein. In some embodiments, the code processing module 2810 is implemented using a processor. The same processor or other circuitry, or separate processors or circuitry, could be used to implement both the encoder module 2804 and the code processing module 2810. As noted above for the encoder module 2804, in a processor-based implementation of the code processing module 2810, processor-executable instructions to configure a processor to perform code processing operations are stored in a non-transitory processor-readable medium, in the memory 2812 for example.

Like the encoder module 2804 and the code processing module 2810, the post-encoding processing module 2814 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 2814, processor-executable instructions to configure a processor to perform post-encoding operations are stored in a non-transitory processor-readable medium, examples of which are described above. In an embodiment, the post-encoding processing module 2814 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 2810, stored to the memory 2812, or otherwise made available to the code processing module 2810 by the post-encoding processing module 2814.

In some embodiments of the code processing module 2810, the coding parameters and/or the ordered sub-channel sequence may be determined based on information from the post-encoding processing module 2814. For instance, the ordered sub-channel sequence may be determined based on the rate-matching scheme determined by the post-encoding processing module 2814. Conversely, in some other embodiments, the post-encoding processing module 2814 may determine a rate-matching scheme based on the coding parameters and/or the ordered sub-channel sequence determined by the code processing module 2810. In yet some other embodiments, the determinations made within the code processing module 2810 and post-encoding processing module 2814 are jointly performed and optimized.

The apparatus 2800 could implement any of various other features that are disclosed herein. For example, the encoder module 2804, the transmitter module 2806, the code processing module 2810, and/or the post-encoding processing module 2814 could be configured to implement any one or more of the features listed or otherwise described above with reference to FIGS. 26 and 27.

In some alternative embodiments, the functionality of the encoder module 2804, the transmitter module 2806, the code processing module 2810, and/or the post-encoding processing module 2814 described herein may be fully or partially implemented in hardware or alternatively in software, for example in modules stored in a memory such as 2812 and executed by one or more processors of the apparatus 2800.

An apparatus could therefore include a processor, and a memory such as 2812, coupled to the processor, storing instructions which, when executed by the processor, cause the processor to perform the functionality and/or embodiments described above in relation to the encoder module 2804, the transmitter module 2806, the code processing module 2810, and/or the post-encoding module 2814 described above.

Figure 29:
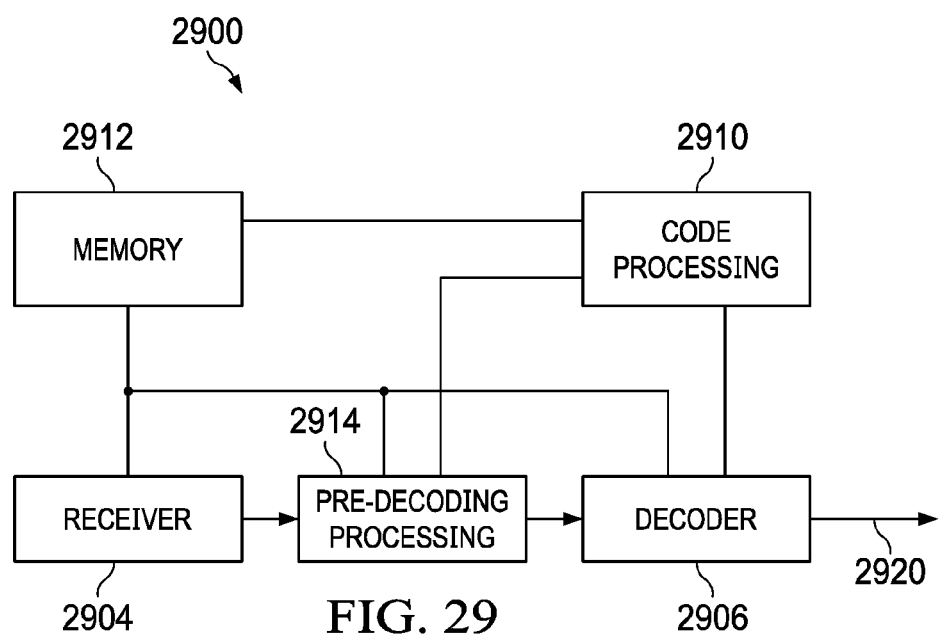
FIG. 29 is a block diagram of an example apparatus for receiving and decoding codewords.

FIG. 29 is a block diagram of an example apparatus for receiving and decoding codewords. The apparatus 2900 includes a receiver module 2904 which is configured to receive signals transmitted wirelessly and which is coupled to a decoder module 2906. The apparatus 2900 also includes a code processing module 2910 coupled to the decoder module 2906 and a pre-decoding processing module 2914. The pre-decoding processing module 2914 is also coupled to the decoder module 2906 and to the receiver module 2904. A memory 2912 also shown in FIG. 29, is coupled to the decoder module 2906, to the code processing module 2910, to the receiver module 2904, and to the pre-decoding processing module 2914.

Although not shown, the receiver module 2904 could include an antenna, demodulator, amplifier, and/or other modules or components of a receive chain or alternatively could be configured to interface with a separate (Radio-Frequency—RF) receiving module. For example, some of all of the modules 2904, 2906, 2910, 2912, 2914 of the apparatus 2900 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 2920 for further receiver processing.

In some embodiments, the memory 2912 is a non-transitory computer readable medium that includes instructions for execution by a processor to implement and/or control operation of the receiver module 2904, decoder module 2906, the code processing module 2910, and the pre-decoding processing module 2914 in FIG. 29, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 2912.

The decoder module 2906 is implemented in circuitry, such as a processor, that is configured to decode received codewords as disclosed herein. In a processor-based implementation of the decoder module 2906, processor-executable instructions to configure a processor to perform decoding operations are stored in a non-transitory processor-readable medium. The non-transitory medium could include, in the memory 2912 for example, one or more solid-state memory devices and/or memory devices with movable and possibly removable storage media.

The code processing module 2910 is implemented in circuitry that is configured to determine (and store to the memory 2912) ordered sub-channel sequences as disclosed herein. In a processor-based implementation of the code-processing module 2910, processor-executable instructions to configure a processor to perform code-processing operations are stored in a non-transitory processor-readable medium, examples of which are described above. Information representing ordered sub-channel sequences, and/or the selected sub-channels could be provided to the decoder module 2906 by the code processing module 2910 for use in decoding received words, and/or stored in the memory 2912 by the code processing module 2910 for subsequent use by the decoder module 2906.

Like the decoder module 2906 and the code processing module 2910, the pre-decoding processing module 2914 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 2914, processor-executable instructions to configure a processor to perform pre-decoding processing operations are stored in a non-transitory processor-readable medium, examples of which are described above. In an embodiment, the pre-decoding processing module 2914 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 2910, stored to the memory 2912, or otherwise made available to the code processing module 2910 by the pre-decoding processing module 2914.

In some embodiments of the code processing module 2910, the ordered sub-channel sequence may be determined based on information from the pre-decoding processing module 2914. For instance, the ordered sub-channel sequence may be determined based on the rate-matching scheme determined by the pre-decoding processing module 2914. Conversely, in some other embodiments, the pre-decoding processing module 2914 may determine a rate-matching scheme based on the coding parameters and/or the ordered sub-channel sequence determined by the code processing module 2910. In yet some other embodiments, the determinations made within the code processing module 2910 and pre-decoding processing module 2914 are jointly performed and optimized.

In some alternative embodiments, the functionality of the receiver module 2904, the decoder module 2906, the code processing module 2910, and/or the pre-decoding processing module 2914 described herein may be fully or partially implemented in software or modules, for example in receiving and decoding modules stored in a memory 2912 and executed by one or more processors of the apparatus 2900.

An apparatus could therefore include a processor, and a memory such as 2912, coupled to the processor, storing instructions which, when executed by the processor, cause the processor to perform the functionality and/or embodiments disclosed herein, or receiving/decoding operations corresponding to transmitting/encoding operations disclosed herein.

The apparatus 2900 could implement any of various other features that are disclosed herein. For example, the decoder module 2906, the receiver module 2904, the code processing module 2910, and/or the pre-decoding processing module 2914 could be configured to implement any one or more of receiving/decoding features corresponding to encoding/transmitting features noted above.

Figure 30:
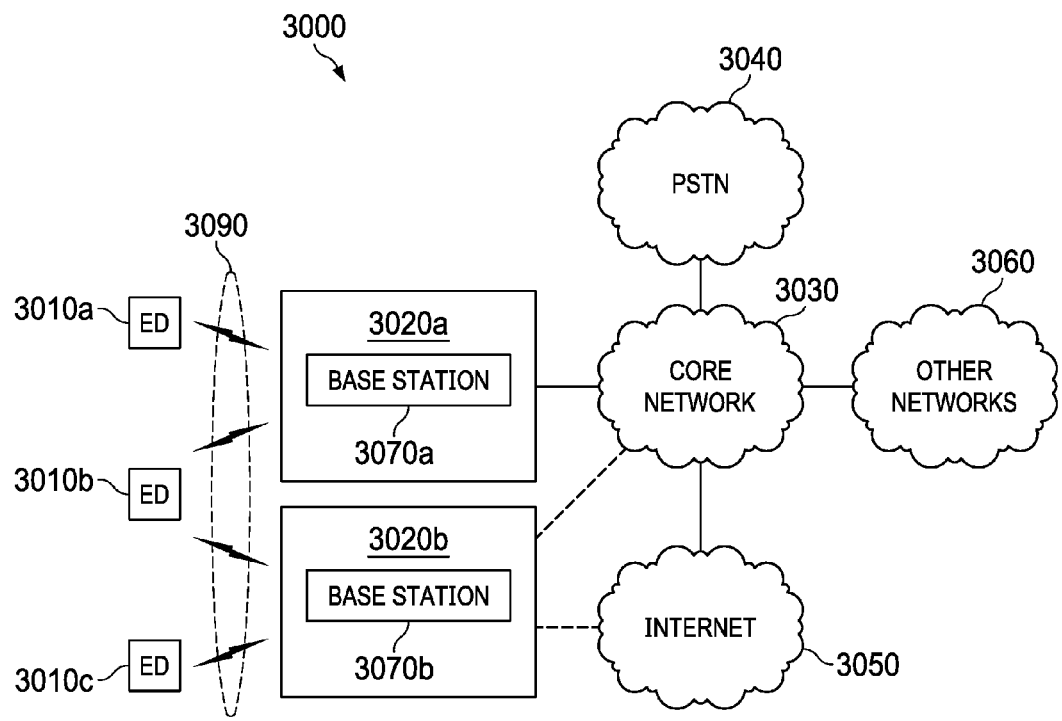
FIG. 30 is a block diagram of an example communication system in which embodiments disclosed herein may be used.

FIG. 30 illustrates an example communication system 3000 in which embodiments of the present disclosure could be implemented. In general, the communication system 100 enables multiple wireless or wired elements to communicate data and other content. The purpose of the communication system 3000 may be to provide content (voice, data, video, text) via broadcast, narrowcast, user device to user device, etc. The communication system 3000 may operate by sharing resources such as bandwidth.

In this example, the communication system 3000 includes electronic devices (ED) 3010a-3010c, radio access networks (RANs) 3020a-3020b, a core network 3030, a public switched telephone network (PSTN) 3040, the internet 3050, and other networks 3060. Although certain numbers of these components or elements are shown in FIG. 30, any reasonable number of these components or elements may be included.

The EDs 3010a-3010c and base stations 3070a-3070b are examples of communication equipment that can be configured to implement some or all of the functionality and/or embodiments described herein. For example, any one of the EDs 3010a-3010c and base stations 3070a-3070b could be configured to implement the encoding or decoding functionality (or both) described above. In another example, any one of the EDs 3010a-3010c and base stations 3070a-3070b could include the apparatus 1100, the apparatus 2900 or both described above in relation to FIGS. 28 and 29.

The EDs 3010a-3010c are configured to operate, communicate, or both, in the communication system 3000. For example, the EDs 3010a-3010c are configured to transmit, receive, or both via wireless or wired communication channels. Each ED 3010a-3010c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 30, the RANs 3020a-3020b include base stations 3070a-3070b, respectively. Each base station 3070a-3070b is configured to wirelessly interface with one or more of the EDs 3010a-3010c to enable access to any other base station 3070a-3070b, the core network 3030, the PSTN 3040, the Internet 3050, and/or the other networks 3060. For example, the base stations 3070a-3070b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 3010a-3010c may be alternatively or additionally configured to interface, access, or communicate with any other base station 3070a-3070b, the internet 3050, the core network 3030, the PSTN 3040, the other networks 3060, or any combination of the preceding. The communication system 3000 may include RANs, such as RAN 3020b, wherein the corresponding base station 3070b accesses the core network 3030 via the internet 3050, as shown.

The EDs 3010a-3010c and base stations 3070a-3070b are examples of communication equipment that can be configured to implement some or all of the functionality and/or embodiments described herein. In the embodiment shown in FIG. 30, the base station 3070a forms part of the RAN 3020a, which may include other base stations, base station controller(s) (BSC), radio network controller(s) (RNC), relay nodes, elements, and/or devices. Any base station 3070a, 3070b may be a single element, as shown, or multiple elements, distributed in the corresponding RAN, or otherwise. Also, the base station 3070b forms part of the RAN 3020b, which may include other base stations, elements, and/or devices. Each base station 3070a-3070b transmits and/or receives wireless signals within a particular geographic region or area, sometimes referred to as a "cell" Or "coverage area". A cell may be further divided into cell sectors, and a base station 3070a-3070b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 3020a-3020b shown is exemplary only. Any number of RAN may be contemplated when devising the communication system 3000.

The base stations 3070a-3070b communicate with one or more of the EDs 3010a-3010c over one or more air interfaces 3090 using wireless communication links e.g. radio frequency (RF), microwave, infrared (IR), etc. The air interfaces 3090 may utilize any suitable radio access technology. For example, the communication system 3000 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 3090.

A base station 3070a-3070b may implement Universal Mobile Telecommunication System (UMTS) Terrestrial Radio Access (UTRA) to establish an air interface 3090 using wideband CDMA (WCDMA). In doing so, the base station 3070a-3070b may implement protocols such as HSPA, HSPA+ optionally including HSDPA, HSUPA or both. Alternatively, a base station 3070a-3070b may establish an air interface 3090 with Evolved UTMS Terrestrial Radio Access (E-UTRA) using LTE, LTE-A, and/or LTE-B. It is contemplated that the communication system 3000 may use multiple channel access functionality, including such schemes as described above. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 3020a-3020b are in communication with the core network 3030 to provide the EDs 3010a-3010c with various services such as voice, data, and other services. The RANs 3020a-3020b and/or the core network 3030 may be in direct or indirect communication with one or more other RANs (not shown), which may or may not be directly served by core network 3030, and may or may not employ the same radio access technology as RAN 3020a, RAN 3020b or both. The core network 3030 may also serve as a gateway access between (i) the RANs 3020a-3020b or EDs 3010a-3010c or both, and (ii) other networks (such as the PSTN 3040, the internet 3050, and the other networks 3060). In addition, some or all of the EDs 3010a-3010c may include functionality for communicating with different wireless networks over different wireless links using different wireless technologies and/or protocols. Instead of wireless communication (or in addition thereto), the EDs 3010a-3010c may communicate via wired communication channels to a service provider or switch (not shown), and to the internet 3050. PSTN 3040 may include circuit switched telephone networks for providing plain old telephone service (POTS). Internet 3050 may include a network of computers and subnets (intranets) or both, and incorporate protocols, such as IP, TCP, UDP. EDs 3010a-3010c may be multimode devices capable of operation according to multiple radio access technologies, and incorporate multiple transceivers necessary to support such.

Figure 31A:
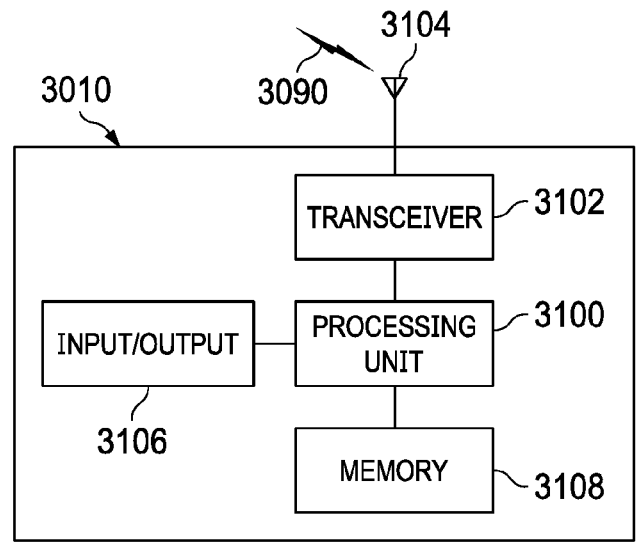
FIGS. 31A-31B are block diagrams of an example Electronic Device (ED) and an example base station which may implement embodiments disclosed herein.
Figure 31B:
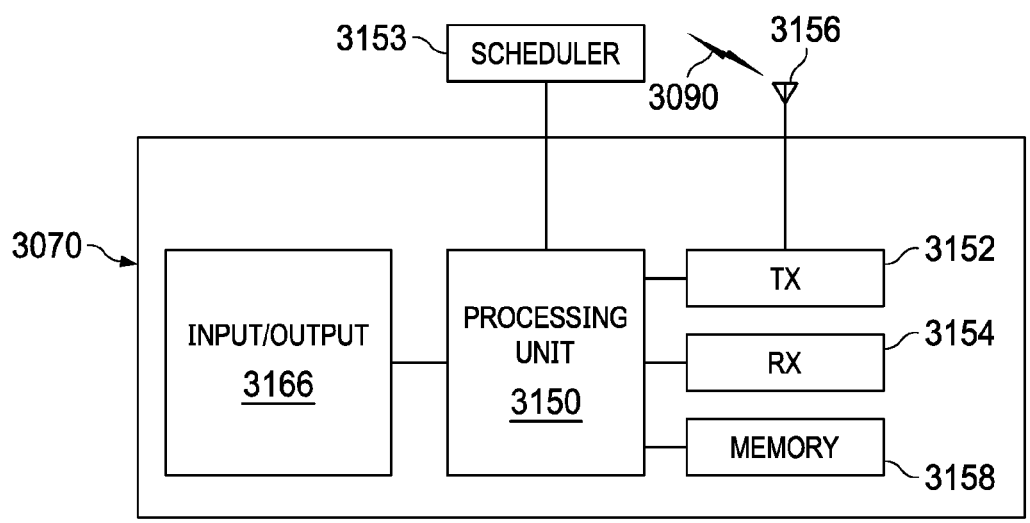

FIGS. 31A and 31B illustrate example devices that may implement the methods and teachings according to this disclosure. In particular, FIG. 31A illustrates an example ED 3010, and FIG. 31B illustrates an example base station 3070. These components could be used in the communication system 3000 or in any other suitable system.

As shown in FIG. 31A, the ED 3010 includes at least one processing unit 3100. The processing unit 3100 implements various processing operations of the ED 3010. For example, the processing unit 3100 could perform signal coding, data processing, power control, input/output processing, or any other functionality enabling the ED 3010 to operate in the communication system 3000. The processing unit 3100 may also be configured to implement some or all of the functionality and/or embodiments described in more detail above. Each processing unit 3100 includes any suitable processing or computing device configured to perform one or more operations. Each processing unit 3100 could, for example, include a microprocessor, microcontroller, digital signal processor, field programmable gate array, or application specific integrated circuit.

The ED 3010 also includes at least one transceiver 3102. The transceiver 3102 is configured to modulate data or other content for transmission by at least one antenna or Network Interface Controller (NIC). The transceiver 3102 is also configured to demodulate data or other content received by the at least one antenna 3104. Each transceiver 3102 includes any suitable structure for generating signals for wireless or wired transmission and/or processing signals received wirelessly or by wire. Each antenna 3104 includes any suitable structure for transmitting and/or receiving wireless or wired signals. One or multiple transceivers 3102 could be used in the ED 3010, and one or multiple antennas 3104 could be used in the ED 3010. Although shown as a single functional unit, a transceiver 3102 could also be implemented using at least one transmitter and at least one separate receiver.

The ED 3010 further includes one or more input/output devices 3106 or interfaces (such as a wired interface to the internet 3050). The input/output devices 3106 permit interaction with a user or other devices in the network. Each input/output device 3106 includes any suitable structure for providing information to or receiving information from a user, such as a speaker, microphone, keypad, keyboard, display, or touch screen, including network interface communications.

In addition, the ED 3010 includes at least one memory 3108. The memory 3108 stores instructions and data used, generated, or collected by the ED 3010. For example, the memory 3108 could store software instructions or modules configured to implement some or all of the functionality and/or embodiments described above and that are executed by the processing unit(s) 3100. Each memory 3108 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 31B, the base station 3070 includes at least one processing unit 3150, at least one transmitter 3152, at least one receiver 3154, one or more antennas 3156, at least one memory 3158, and one or more input/output devices or interfaces 3166. A transceiver, not shown, may be used instead of the transmitter 3152 and receiver 3154. A scheduler 3153 may be coupled to the processing unit 3150. The scheduler 3153 may be included within or operated separately from the base station 3070. The processing unit 3150 implements various processing operations of the base station 3070, such as signal coding, data processing, power control, input/output processing, or any other functionality. The processing unit 3150 can also be configured to implement some or all of the functionality and/or embodiments described in more detail above. Each processing unit 3150 includes any suitable processing or computing device configured to perform one or more operations. Each processing unit 3150 could, for example, include a microprocessor, microcontroller, digital signal processor, field programmable gate array, or application specific integrated circuit.

Each transmitter 3152 includes any suitable structure for generating signals for wireless or wired transmission to one or more EDs or other devices. Each receiver 3154 includes any suitable structure for processing signals received wirelessly or by wire from one or more EDs or other devices. Although shown as separate components, at least one transmitter 3152 and at least one receiver 3154 could be combined into a transceiver. Each antenna 3156 includes any suitable structure for transmitting and/or receiving wireless or wired signals. Although a common antenna 3156 is shown here as being coupled to both the transmitter 3152 and the receiver 3154, one or more antennas 3156 could be coupled to the transmitter(s) 3152, and one or more separate antennas 3156 could be coupled to the receiver(s) 3154. Each memory 3158 includes any suitable volatile and/or non-volatile storage and retrieval device(s) such as those described above in connection to the ED 3010. The memory 3158 stores instructions and data used, generated, or collected by the base station 3070. For example, the memory 3158 could store software instructions or modules configured to implement some or all of the functionality and/or embodiments described above and that are executed by the processing unit(s) 3150.

Each input/output device 3166 permits interaction with a user or other devices in the network. Each input/output device 3166 includes any suitable structure for providing information to or receiving/providing information from a user, including network interface communications.

Various embodiments disclosed herein relate to specifying sub-channel sequences using shorter ordered sequences of numbers. This could reduce memory space requirements for ordered sequence storage.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

A wireless device, transmission point, or reception point, e.g., network component or a user equipment may each comprise an encoder and a decoder.

Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input/output devices, such as a speaker, microphone, mouse, touchscreen, keypad, keyboard, printer, display, and the like. The processing unit may include a central processing unit (CPU), memory, a mass storage device, a video adapter, and an I/O interface connected to a bus.

The bus may be one or more of any type of several bus architectures including a memory bus or memory controller, a peripheral bus, video bus, or the like. The CPU may comprise any type of electronic data processor. The memory may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

The following references are related to subject matter of the present application. Each of these references is incorporated herein by reference in its entirety:

Provisional Application Ser. No. 62/396,618 "Method and Device for Assigning Dynamic Frozen Bits and Constructing a Parity Function on Them in a Polar Code".

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for polar code encoding, the method comprising:
    transmitting at least a first segment of information bits over a first set of sub-channels; and
    transmitting at least a second segment of information bits and a masked parity bit over a second set of sub-channels, wherein a value of the masked parity bit is equal to a bitwise combination of a first parity bit computed from the first segment of information bits and a second parity bit computed from the second segment of information bits, the second set of sub-channels being different than the first set of sub-channels.

2. The method of claim 1, wherein the first parity bit is computed directly from the first segment of information bits, and the second parity bit is computed directly from the second segment of information bits.

3. The method of claim 1, further comprising:
    mapping the first segment of information bits to sub-channels in the first set of sub-channels;
    mapping the second segment of information bits to sub-channels in the second set of sub-channels; and
    computing at least the first parity bit based on the first segment of information bits in the first set of sub-channels and at least the second parity bit based on the second segment of information bits in the second set of sub-channels.

4. The method of claim 1, wherein the masked parity bit is transmitted over a single sub-channel in the second set of sub-channels.

5. The method of claim 4, wherein none of the first parity bit, the second parity bit, and the masked parity bit are transmitted over the first set of sub-channels.

6. The method of claim 4, wherein the masked parity bit is transmitted over both a single sub-channel in the second set of sub-channels and a single sub-channel in the first set of sub-channels.

7. The method of claim 4, wherein the first parity bit is transmitted over a single sub-channel in the first set of sub-channels.

8. The method of claim 4, wherein the first parity bit and the second parity bit are transmitted over different sub-channels in the second set of sub-channels.

9. The method of claim 8, wherein neither the first parity bit nor the second parity bit are transmitted over the first set of sub-channels.

10. The method of claim 8, wherein the first parity bit and the second parity bit are transmitted over the first set of sub-channels.

11. The method of claim 4, wherein the first parity bit is transmitted over a single sub-channel in the second set of sub-channels without being transmitted over any sub-channel in the first set of sub-channels, and wherein the second parity bit is transmitted over a single sub-channel in the first set of sub-channels without being transmitted over any sub-channel in the second set of sub-channels.

12. The method of claim 1, further comprising:
    computing the masked parity bit according to a bitwise AND of the first parity bit and at least the second parity bit.

13. The method of claim 1, further comprising:
    computing the masked parity bit according to a bitwise OR of the first parity bit and at least the second parity bit.

14. The method of claim 1, further comprising:
    computing the masked parity bit according to a bitwise XOR of the first parity bit and at least the second parity bit.

15. The method of claim 1, further comprising:
    before transmitting,
        polar encoding at least the first segment of information bits; and
        separately polar encoding at least the second segment of information bits and the masked parity bit.

16. The method of claim 1, wherein the masked parity bit is a cyclic redundancy check (CRC) bit, a parity check bit, or an error correcting code (ECC) bit.

17. An apparatus comprising:
    a processor; and
    a non-transitory computer readable storage medium storing programming for execution by the processor, the programming including instructions to:
        transmit at least a first segment of information bits over a first set of sub-channels; and
        transmit at least a second segment of information bits, and a masked parity bit, over a second set of sub-channels, wherein a value of the masked parity bit is equal to a bitwise combination of a first parity bit computed from the first segment of information bits and a second parity bit computed from the second segment of information bits, the second set of sub-channels being different than the first set of sub-channels.

18. The apparatus of claim 17, wherein the first parity bit is computed directly from the first segment of information bits, and the second parity bit is computed directly from the second segment of information bits.

19. A method for polar code decoding, the method comprising:

receiving a first polar-encoded bit-stream carrying at least first segment of information bits over a first set of sub-channels; and receiving a second polar-encoded bit-stream carrying at least a second segment of information bits and a masked parity bit over a second set of sub-channels, wherein a value of the masked parity bit is equal to a bitwise combination of a first parity bit computed from the first segment of information bits and a second parity bit computed from the second segment of information bits, the second set of sub-channels being different than the first set of sub-channels.

20. The method of claim 19, wherein the first parity bit is computed directly from the first segment of information bits, and the second parity bit is computed directly from the second segment of information bits.

21. The method of claim 19, further comprising:

performing error detection on the first segment of information bits received over the first set of sub-channels in accordance with at least the masked parity bit received over the first set of sub-channels.

22. An apparatus comprising:

a processor; and a non-transitory computer readable storage medium storing programming for execution by the processor, the programming including instructions to:

receive a first polar-encoded bit-stream carrying at least first segment of information bits over a first set of sub-channels; and receive a second polar-encoded bit-stream carrying at least a second segment of information bits and a masked parity bit over a second set of sub-channels, wherein a value of the masked parity bit is equal to a bitwise combination of a first parity bit computed from the first segment of information bits and a second parity bit computed from the second segment of information bits, the second set of sub-channels being different than the first set of sub-channels.

23. The apparatus of claim 22, wherein the programming further includes instructions to perform error detection on the first segment of information bits received over the first set of sub-channels in accordance with at least the masked parity bit received over the first set of sub-channels.

24. The apparatus of claim 22, wherein the first parity bit is computed directly from the first segment of information bits, and the second parity bit is computed directly from the second segment of information bits.

* * * * *